US008217480B2

(12) United States Patent
Ting et al.

(10) Patent No.: US 8,217,480 B2
(45) Date of Patent: Jul. 10, 2012

(54) BARRIER INFRARED DETECTOR

(75) Inventors: David Z. Ting, Arcadia, CA (US);
Arezou Khoshakhlagh, Pasadena, CA (US); Alexander Soibel, South Pasadena, CA (US); Cory J. Hill, Chesterfield, MO (US); Sarath D. Gunapala, Stevenson Ranch, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/197,588

(22) Filed: Aug. 3, 2011

(65) Prior Publication Data
US 2012/0145996 A1 Jun. 14, 2012

Related U.S. Application Data

(60) Provisional application No. 61/405,881, filed on Oct. 22, 2010.

(51) Int. Cl.
*H01L 27/14* (2006.01)
(52) U.S. Cl. .................. 257/431; 257/15; 257/E31.001
(58) Field of Classification Search .................. 257/15, 257/431, E31.001
See application file for complete search history.

(56) References Cited

U.S. PATENT DOCUMENTS

| 4,679,063 | A | 7/1987 | White |
| 6,226,152 | B1 | 5/2001 | Tanaka et al. |
| 6,433,354 | B1 | 8/2002 | Kuan et al. |
| 6,455,908 | B1 | 9/2002 | Johnson et al. |
| 7,687,871 | B2 | 3/2010 | Maimon |
| 7,795,640 | B2 | 9/2010 | Klipstein |
| 7,928,473 | B2 | 4/2011 | Klipstein |
| 8,022,390 | B1 | 9/2011 | Kim et al. |
| 2007/0215900 | A1 | 9/2007 | Maimon |
| 2008/0111152 | A1 | 5/2008 | Scott et al. |
| 2009/0127462 | A1 | 5/2009 | Gunapala et al. |
| 2009/0256231 | A1 | 10/2009 | Klipstein |

(Continued)

FOREIGN PATENT DOCUMENTS
WO  WO2005/004243  1/2005
(Continued)

OTHER PUBLICATIONS

Maimon et al., "InAsSb/GaAOSb/InAsSb nbn detector for the 3-5μm", Abstract Book of the 11$^{th}$ International Conference on Narrow Gap Semiconductors, 2003, p. 70.

(Continued)

*Primary Examiner* — Matthew Reames
(74) *Attorney, Agent, or Firm* — Kauth, Pomeroy, Peck & Bailey LLP

(57) ABSTRACT

A superlattice-based infrared absorber and the matching electron-blocking and hole-blocking unipolar barriers, absorbers and barriers with graded band gaps, high-performance infrared detectors, and methods of manufacturing such devices are provided herein. The infrared absorber material is made from a superlattice (periodic structure) where each period consists of two or more layers of InAs, InSb, InSbAs, or InGaAs. The layer widths and alloy compositions are chosen to yield the desired energy band gap, absorption strength, and strain balance for the particular application. Furthermore, the periodicity of the superlattice can be "chirped" (varied) to create a material with a graded or varying energy band gap. The superlattice based barrier infrared detectors described and demonstrated herein have spectral ranges covering the entire 3-5 micron atmospheric transmission window, excellent dark current characteristics operating at least 150K, high yield, and have the potential for high-operability, high-uniformity focal plane arrays.

20 Claims, 23 Drawing Sheets

U.S. PATENT DOCUMENTS

| | | |
|---|---|---|
| 2010/0006822 A1 | 1/2010 | Ting |
| 2010/0072514 A1 | 3/2010 | Ting et al. |
| 2010/0155777 A1 | 6/2010 | Hill et al. |
| 2010/0230720 A1 | 9/2010 | Wicks |
| 2011/0037097 A1 | 2/2011 | Scott et al. |

FOREIGN PATENT DOCUMENTS

| | | |
|---|---|---|
| WO | WO2008/061141 | 5/2008 |

OTHER PUBLICATIONS

Carras et al., "Interface band gap engineering in InAsSb photodiodes", Applied Physics Letters, 2005, vol. 87, pp. 102103-1 to 102103-3.

Wilk et al., "Type-II InAsSb/InAs strained quantum-well laser diodes emitting at 3.5µm", Applied Physics Letters, Oct. 9, 2000, vol. 77, No. 15, pp. 2298-2300.

Huang et al, "epitaxial growth and characterization in InAs/GaSb and InAs/InAsSb type-II superlattices on GaSb substrates by metalorganic chemical vapor disposition for long wavelength infrared photodetectors", Journal of Crystal Growth, 2011, vol. 314, pp. 92-96.

Maimon et al., "nBn detector, an infrared detector with reduced dark current and higher operating temperatures", Applied Physics Letters, 2006, vol. 89, 151109-1 to 151109-3.

Zhang, "Antimonide-Related Strained-Layer Heterostructures," edited by M.O. Manasreh, Gordon and Breach Science Publishers, Amsterdam, 1997, pp. 461-500.

Zhang, "Continuous wave operation of InAs/InAs$_x$Sb$_{1-x}$ midinfrared lasers", Applied Physics, Jan. 9, 1994, vol. 66, No. 2, pp. 118-120.

Ekins-Daukes et al., "Strain-Balanced Criteria for Multiple Quantum Well Structures and Its Signature in X-ray Rocking Curves", Crystal Grown & Design, 2002, vol. 2, No. 4, pp. 287-292.

Klipstein, ""Xbn" Barrier Photodetectors for High Sensitivity and High Operating Temperature Infrared Sensors", Proc. of SPIE, 2008, vol. 6940, pp. 69402U-1-69402U-12.

Plis et al., Lateral diffusion of minority carriers in InAsSb-based nBn detectors:, Applied physics Letters, 2010, vol. 97, pp. 123503-1-123503-3.

Hill et al., Demonstration of large format mid-wavelength infrared focal play arrays based on superlattice and Bird detector structures, Infrared Physics & Technology, 2009, vol. 52, pp. 348-352.

Ting et al., "A high-performance long wavelength superlattice complementary barrier infrared detector", Applied Physics Letters, 2009, vol. 95, pp. 023508-1-023508-3.

Lackner et al., "InAsSb and InPSb Materials for Mid Infrared Photodetectors", Proceedings, 2010, IPRM, 4 pgs.

Lackner et al., "Strain balanced InAs/InAsSb superlattice structures with optical emission to 10µm", Applied Physics Letters, 2009, vol. 95, pp. 081906-1-081906-3.

Gautam et al., "Performance improvement of longwave infrared photodetector based on type-II InAs/GaSb superlattices using unipolar current blocking layers", Applied Physics Letters, 2010, vol. 96, pp. 231107-1-231107-3.

Lackner et al., "Growth of InAsSb/InAs MQWs on GaSb for mid-IR photodetector applications", Journal of crystal Growth, 2009, vol. 311, pp. 3563-3567.

Kim et al., "Mid-IR focal plane array based on type II InAs/GaSb strain layer supperlattice detector with nBn design", Applied Physics Letters, 2008, vol. 92, pp. 183502-1-183502-3.

BARRIER INFRARED DETECTOR

STATEMENT OF RELATED APPLICATIONS

The current application claims priority to U.S. Provisional Application No. 61/405,881, filed Oct. 22, 2010, the disclosure of which is incorporated herein by reference.

FEDERAL FUNDING SUPPORT

The invention described herein was made in the performance of work under a NASA contract, and is subject to the provisions of Public Law 96-517 (35 USC 202) in which the Contractor has elected to retain title.

FIELD OF THE INVENTION

The current invention is directed to an infrared detector; and more particularly to a barrier infrared detector capable of operating in the mid-wave infrared at high operating temperatures.

BACKGROUND OF THE INVENTION

The recent emergence of barrier infrared detectors such as the nBn and the XBn have resulted in mid-wave infrared (MWIR) detectors with substantially higher operating temperatures than previously available in III-V semiconductor based MWIR detectors. The initial nBn devices used either InAs absorber grown on InAs substrate, or lattice-matched InAsSb alloy grown on GaSb substrate, resulting in cutoff wavelengths of ~3.2 micron and ~4 micron, respectively. While these detectors could operate at much higher temperatures than existing MWIR detectors based on InSb, their spectral range does not cover the full MWIR atmospheric transmission window (3-5 micron). There have also been nBn detectors based on the InAs/GaSb type-II superlattice absorber, and, although these InAs/GaSb superlattice based detectors have sufficiently long cutoff wavelength to cover the entire MWIR atmospheric transmission window, they have not achieved very high performance levels.

While digital alloys based on periodic insertions of thin layers of InSb into InAs or InAsSb hosts have been proposed (and demonstrated) as absorbers for barrier infrared detectors, these types of digital alloy based barrier infrared detector have exhibited extended cutoff wavelengths, they still have limited spectral range. The InAs/InAsSb superlattice has been used in midwave infrared (MWIR) lasers. (See, Yong-Hang Zhang, Appl. Phys. Lett. 66(2), 118-120 (1995); and A. Wilk, M. et al., Appl. Phys. Lett. 77(15), 2298-2300 (2000), the disclosures of each of which are incorporated herein by reference.) In addition, it has been suggested that the InAs/InAsSb superlattice may be suitable for longwave infrared (LWIR) detector applications. (See, Yong-Hang Zhang, pp. 461-500, in *Antimonide-Related Strained-Layer Heterostructures*, edited by M. O. Manasreh, Gordon and Breach Science Publishers, Amsterdam (1997), the disclosure of which is incorporated herein by reference.) Recent papers on growths of strain-balanced InAs/InAsSb superlattices on GaSb substrates also suggest that they may be useful for infrared detector applications, as they demonstrated photoluminescence or photoconductive response in the infrared. (See, D. Lackner, et al., Appl. Phys. Lett. 95, 081906 (2009); D. Lackner, et al., "InAsSb and InPSb materials for mid infrared photodetectors," 2010 International Conference on Indium Phosphide & Related Materials (IPRM) (2010); and Y. Huang, J.-H. Ryou, et al., J. Crystal Growth 314, 92-96 (2011), the disclosure of each of which are incorporated herein by reference.) However, even with a high quality infrared absorber material as the starting point, building a high-performance infrared photodetector still demands considerable sophistication, as it requires the intricate interplay among many building components.

Infrared detector performance depends strongly on device design. The use of heterostructure designs to enhance infrared detector performance is a well-established practice, and is prevalent in III-V semiconductor based infrared detectors. A particularly useful heterostructure construct is the unipolar barrier, which can block one carrier type (electron or hole) but allows the substantially un-impeded flow of the other, as illustrated in FIG. 1. (See, D. Z.-Y. Ting, et al., *Appl. Phys. Lett.* 95, 023508 (2009), the disclosure of which is incorporated herein by reference.) Unipolar barriers have also been used extensively to enhance infrared detector performance. White used unipolar barriers to block the flow of majority carrier dark current in photoconductors without impeding minority carriers. (See, U.S. Pat. No. 4,679,063, the disclosure of which is incorporated herein by reference.) A double heterostructure (DH) detector design can be used to reduce diffusion dark current emanating from the diffusion wings surrounding the absorber layer. (See, M. Carras, et al., Appl. Phys. Lett. 87(10) 102103 (2005), the disclosure of which is incorporated herein by reference.) The nBn or XBn detector structure uses a unipolar barrier to suppress dark current associated with Shockley-Read-Hall processes without impeding photocurrent flow, as well as to suppress surface leakage current. (See, e.g., S. Maimon and G. W. Wicks, Abstract Book of the 11th International Conference on Narrow Gap Semiconductors, Buffalo, N.Y., p. 70 (2003); S. Maimon and G. W. Wicks, *Appl. Phys. Lett.* 89(15), 151109 (2006); U.S. Pat. No. 7,687,871 B2; WO 2005/004243 A1; and P. C. Klipstein, Proc. SPIE 6940, 69402U (2008), the disclosures of each of which are incorporated herein by reference. Other conventional detector devices can be found in the following references, the disclosures of each of which are incorporated herein by reference: WO 2008/061141; U.S. Pat. No. 7,795,640; U.S. Pat. No. 4,679,063; US Pub. No. 2007/0215900; US Pub. No. 2010/0006822; US Pub. No. 2009/0127462; and U.S. Pub. No. 2010/0155777.)

In general, unipolar barriers can be used to implement the barrier infrared detector architecture for increasing the collection efficiency of photo-generated carriers (by deflecting them towards the collector, in the same way a back-surface field layer functions in a solar cell structure), and reducing dark current generation without inhibiting photocurrent flow. However, despite the substantial advantages they offer, unipolar barriers are not always readily attainable for the desired infrared absorber material, as the proper band offsets must exist between the absorber and the barrier, and both the absorber and barrier materials require (near) lattice matching to available substrates on which they are grown.

Another construct that is useful in building high-performance heterostructure infrared detectors is material with graded band gap. Graded-gap (or chirped) material is useful in creating a quasi-electric field for driving carriers in the desired direction, and for smoothly connecting two regions with different band gaps.

Accordingly, a need exists to develop barrier infrared detectors that incorporate the properties of the these novel superlattice absorbers, as well as their matching unipolar barriers and graded gap materials to form detectors capable of operating in 3-12 micron spectral range covering 3-5 micron and/or 8-12 micron atmospheric transmission window, at high temperature, and with high performance.

SUMMARY OF THE INVENTION

The current invention is directed to barrier infrared detectors capable of operating in and across the 3-5 micron and/or 8-12 micron atmospheric transmission window.

In one embodiment, the current invention is directed to an absorber layer for a photodetector including:
- a substrate formed of a substrate material having a substrate lattice constant;
- a superlattice disposed on the substrate, where the superlattice is formed from a plurality of supercell structures, themselves formed from at least InAsSb and at least a semiconductor material selected from InAs, InAsSb, InGaAs and InAsSb;
- wherein the semiconductor materials are chosen to yield a substantially minimally strained configuration wherein the thickness of each of the layers does not exceed a critical thickness above which the layer is no longer coherently strained; and
- wherein the energy band gap structure of the superlattice including the band gap, conduction band edge and the valence band edge of the superlattice depends on the structure of the supercell.

In another embodiment, the invention is directed to an absorber layer wherein the substrate material is GaSb. In another such embodiment the substrate is a material selected from the group consisting of Si, GaAs, InP and InAs, and further includes a metamorphic buffer layer to modify the in-plane substrate lattice constant.

In still another embodiment, the invention is directed to an absorber layer where the plurality of supercells are formed from layers of InAs and InAsSb. In such an embodiment, the energy band gap of the superlattice decreases as the period of the supercell increases.

In yet another embodiment, the invention is directed to an absorber layer where the plurality of supercells are formed from layers of InGaAs and InAsSb.

In still yet another embodiment, the invention is directed to an absorber layer where the thicknesses of each of the plurality of materials are chosen such that the average superlattice lattice constant of the superlattice is approximately equal to the substrate lattice constant.

In still yet another embodiment, the invention is directed to an absorber layer where the period of the supercells of the superlattice varies such that the absorber layer has a graded energy band gap structure.

In still yet another embodiment, the invention is directed to an absorber layer where each of the supercells comprises two or more distinct layers.

In still yet another embodiment, the invention is directed to an absorber layer where each of the plurality of supercells are formed from at least two semiconductor materials chosen such that the tensile and compressive strains counteract and balance each other to yield a minimally strained configuration in said superlattice. In such an embodiment, the superlattice may have a plurality of additional substantially minimally strained configurations determined by increasing the thicknesses of each of said layers of each of the supercells of the superlattice by a constant factor "$\alpha$".

In still yet another embodiment, the invention is directed to a method of forming an absorber layer. In one such embodiment, the method includes:
- providing a formed of a substrate material having a substrate lattice constant;
- depositing a superlattice onto the substrate, the superlattice formed from a plurality of supercells, formed from a plurality of layers of at least InAsSb and at least a semiconductor material selected from the group consisting of InAs, InAsSb and InGaAs;
- wherein the combination of semiconductor materials in each layer of each supercell are chosen to yield a substantially minimally strained configuration, and wherein the thickness of each of the layers does not exceed a critical thickness beyond which the layer is no longer coherently strained; and
- wherein the energy band gap structure of each supercell including the band gap, conduction band edge and valence band edge of the superlattice depends on the structure of the supercell.

In still yet another embodiment, the method of the invention includes a substrate material of GaSb, and the plurality of layers are formed from InAs and InAsSb.

In still yet another embodiment, the method of the invention includes a step of depositing the superlattice using a molecular beam epitaxy technique. In one such embodiment the method includes maintaining a flux of In and As continuously, and varying a flux of Sb to create the alternating layers of InAs and InAsSb.

In still yet another embodiment, the method of the invention further comprises varying the deposition thickness of the plurality of layers such that the period of the superlattice varies such that the absorber layer is formed with a graded energy band gap structure.

In still yet another embodiment, the invention is directed to a unipolar hole barrier for an absorber layer in accordance with the current invention. In one such embodiment, the hole barrier superlattice includes a barrier disposed on the substrate adjacent to said absorber layer superlattice. In another such embodiment, the hole barrier superlattice is formed from a plurality of hole-barrier supercells, each formed of a plurality of layers of at least two semiconductor materials selected from the group consisting of InAs/InAsSb, InAs/AlSb, InAsSb/AlAsSb, and InAs/AlInSb, wherein the energy band gap structure of the hole barrier including band gap, conduction band edge and valence band edge of the hole barrier superlattice depends on the structure of the hole-barrier supercell.

In still yet another embodiment, the unipolar hole barrier of the invention has a period that is shorter than the period of the absorber layer such that the conduction band edge of the hole barrier superlattice substantially matches the conduction band edge of the absorber layer superlattice, while the band gap of the hole barrier provides a substantial barrier to holes from the absorber layer superlattice. In one such embodiment, both the absorber supercell and the hole-barrier supercell are formed from InAs and InAsSb, with the same InAsSb composition. In another such embodiment, the absorber layer superlattice is formed of InAs and InAsSb, and where the InAsSb of the absorber layer superlattice has a higher Sb content than the InAsSb semiconductor material of the hole barrier.

In still yet another embodiment, the unipolar hole barrier of the invention includes a graded energy band gap region comprising a graded region superlattice formed of a plurality of layers of semiconducting materials, disposed between the absorber layer superlattice and the hole barrier layer superlattice, where the period of the graded region varies such that any discontinuity between the conduction band edge of the absorber layer superlattice and the conduction band edge of the hole barrier layer superlattice is smoothed.

In still yet another embodiment, the unipolar hole barrier of the invention is formed from a combination of materials selected from the group consisting of InAs/AlSb, InAsSb/AlAsSb, and InAs/AlInSb.

In still yet another embodiment, the unipolar hole barrier of the invention has a period that is constant, and where the minimally strained configuration is obtained by varying the composition of the superlattice material.

In still yet another embodiment, the unipolar hole barrier of the invention includes semiconductor hole materials that are one of either random or digital alloys.

In still yet another embodiment, the invention is directed to a unipolar electron barrier disposed on the substrate adjacent to said absorber layer superlattice. In one such embodiment, the electron barrier is formed from an electron barrier material selected from one of either AlAsSb or AlGaSb, wherein the alloy composition of the electron barrier material is selected such that the valence band edge of the electron barrier substantially matches the valence band edge of the absorber layer, while the band gap of the electron barrier provides a substantial barrier to electrons from said absorber layer.

In still yet another embodiment, the unipolar electron barrier of the invention is formed from an electron barrier material comprising AlGaAsSb; wherein the alloy composition of the electron barrier material is selected such that the barrier material is substantially lattice-matched to GaSb, and that the valence band edge of the electron barrier substantially matches the valence band edge of the absorber layer, while the band gap of the electron barrier provides a substantial barrier to electrons from said absorber layer.

In still yet another embodiment, the unipolar electron barrier of the invention includes a superlattice formed from a plurality of electron barrier supercells, each of said supercell being formed from a plurality of layers of at least two semiconductor materials, where the energy band gap structure of the electron barrier superlattice including the band gap, conduction band edge and valence band edge of the electron barrier superlattice depends on the structure of the electron barrier supercell, and where the supercell is selected such that the valence band edge of the electron barrier superlattice substantially matches the valence band edge of the absorber layer superlattice, while the band gap of the electron barrier superlattice provides a substantial barrier to electrons from the absorber layer superlattice. In one such embodiment, the unipolar electron barrier of the invention includes a plurality of two layer supercells comprising AlSbAs/GaSb. In another such embodiment, the alloy composition of the AlSbAs layer in the two layer AlSbAs/GaSb supercell is selected such that the AlSbAs lattice constant substantially matched that of the GaSb substrate. In still another such embodiment, the first electron barrier semiconductor material is the GaSb semiconductor material such that varying the thickness of the GaSb forms a graded-gap electron barrier.

In still yet another embodiment, the unipolar electron barrier superlattice of the invention includes at least one three layer supercell. In one such embodiment, the three layer supercell is selected from one of either AlSb/AlAs/GaSb or AlSb/GaSb/AlAs. In another such embodiment, the thickness ratio of the AlAs layer to the AlSb layer in a supercell is approximately 1 monolayer to 11 monolayers, and the thickness of the AlAs layer does not substantially exceed one monolayer. In still another such embodiment, the first electron barrier semiconductor material is the GaSb semiconductor material such that varying the thickness of the GaSb forms a graded-gap electron barrier.

In still yet another embodiment, the unipolar electron barrier of the invention includes a plurality of four layer supercells comprising AlSb/AlAs/Alsb/GaSb. In one such embodiment, the ratio of the thickness of the AlAs layer to the total thickness of the AlSb layers in a supercell is approximately 1 monolayer to 11 monolayers, and the thickness of the sum of the AlAs layers does not substantially exceed one monolayer. In another such embodiment, the first electron barrier semiconductor material is the GaSb semiconductor material such that varying the thickness of the GaSb forms a graded-gap electron barrier.

In still yet another embodiment, the invention is directed to an infrared photodetector. In one such embodiment, the detector includes:

a substrate formed of a substrate material having a substrate lattice constant;

at least one absorber superlattice disposed on the substrate, formed from a plurality of supercells, each of said supercells being formed from a plurality of layers of at least InAsSb and at least a semiconductor material selected from the group consisting of InAs, InAsSb and InGaAs;

at least two contacts layers disposed on the substrate in electrical communication with said at least one absorber superlattice such that a current may pass therethrough;

wherein the energy band gap structure of the absorber superlattice including the band gap, conduction balance edge and valence band edge of the superlattices depend on the structure of the supercell, and wherein the thickness of each of the layers does not exceed a critical thickness beyond which the layer is no longer coherently strained; and at least one unipolar barrier layer being disposed between said at least one absorber layer superlattice and said contact layer, wherein the band gap structure of the unipolar barrier layer is designed such that each of the at least one barrier layer band gaps presents a substantial barrier between one of either the valence band edge or conduction band edge of said superlattice layers, while substantially matching the other of either the valence band edge or conduction band edge between said superlattice layers.

In still yet another embodiment, the detector of the invention has a substrate that incorporates a GaSb material, the at least one absorber superlattice and the at least two contact layer superlattices are formed from an InAs/InSbAs material, and the barrier layer is an electron blocking unipolar barrier layer formed from an AlAsSb material.

In still yet another embodiment, the detector of the invention has a photoresponse in the atmospheric transmission window between 3 and 5 microns, and a cutoff wavelength of greater than 5 microns while operating at 150 K or above.

In still yet another embodiment, the detector of the invention is a dual-band nBn detector comprising two absorber superlattices have different energy band gap structures, where the at least one unipolar barrier layer is an electron blocking unipolar barrier disposed between the two absorber superlattices, where said electron blocking unipolar barrier has a graded band gap such that a substantial barrier is disposed between the conduction band edges of the two absorber superlattices while the valence band edges of said absorber superlattices are smoothly bridged. In one such embodiment, both the absorber superlattices are formed from InAs/InAsSb materials with identical composition but different periods. In another such embodiment, the electron blocking unipolar barrier is formed from a four-layer superlattice comprising AlSb/AlAs/AlSb/GaSb, and wherein the valence band edge of said electron barrier is graded by varying the thickness of the GaSb layer.

In still yet another embodiment, the detector of the invention is a dual-band pBp detector comprising two absorber superlattices having different energy band gap structures, where the at least one unipolar barrier layer is a hole blocking unipolar barrier disposed between the two absorber superlattices, wherein said hole blocking unipolar barrier has a graded band gap such that a substantial barrier is disposed between the valence band edges of the two absorber superlattices while the conduction band edges of said absorber superlattices are smoothly bridged.

In still yet another embodiment, the detector of the invention is formed such that both the absorber superlattices are formed from InAs/InAsSb materials with identical composition but different periods. In one such embodiment, the hole blocking unipolar barrier is formed from a superlattice material selected from one of either InAs/AlSb or InAsSb/AlAsSb.

In another such embodiment, the hole blocking unipolar barrier is formed from an InAs/InAsSb superlattice having an identical composition to the absorber superlattices, but a different period.

In still yet another embodiment, the detector of the invention is a double heterostructure detector comprising a single absorber superlattice being p-type doped, and further comprising two barrier layers disposed at either end of said absorber superlattice, where one of said barrier layers is an electron blocking unipolar barrier such that at a first end of the absorber superlattice a substantial barrier is formed against the conduction band edge thereof while the valence band edge is substantially matched to the valence band edge of an adjacent contact layer thereto, and where one of said barrier layers is a hole blocking unipolar barrier such that at a second end of the absorber superlattice a substantial barrier is formed against the valence band edge thereof while the conduction band edge is substantially matched to the conduction band edge of an adjacent contact layer thereto.

In still yet another embodiment, the detector of the invention includes a hole barrier and an absorber superlattice formed from InAs/InAsSb superlattices each having identical composition but different period, and an electron barrier formed from a four layer superlattice comprising AlSb/AlAs/AlSb/GaSb, wherein the band edges of the electron barrier are graded by varying the thickness of the GaSb layer.

In still yet another embodiment, the detector of the invention is designed such that the absorber superlattice is formed from an InAs/InAsSb superlattice. In another such embodiment, the hole barrier is formed from one of either an InAs/AlSb superlattice or an InAsSb/AlAsSb superlattice, and the electron barrier is formed from an AlAsSb alloy.

In still yet another embodiment, the detector of the invention is a complementary barrier detector comprising:
 a single absorber superlattice being p-type doped;
 an electron blocking unipolar barrier layer disposed between a first ends of said absorber superlattice and said contact layer superlattice;
 a hole blocking unipolar barrier layer disposed at a second end of said p-type absorber superlattice; and
 a graded-gap transition layer superlattice disposed between said p-type absorber superlattice and said hole blocking unipolar barrier layer.

In still yet another embodiment, the detector of the invention includes a hole barrier, an absorber superlattice and a contact layer superlattice that are all formed from InAs/InAsSb superlattices having identical composition but different period such that the hole barrier has a larger band gap, and where the transition layer superlattice is formed from an InAs/InAsSb superlattice having a period that varies such that the band gap of said transition layer superlattice is graded such that the conduction band edges of said hole barrier and said absorber superlattice are smoothly bridged, and where the electron barrier is formed from a four layer superlattice comprising AlSb/AlAs/AlSb/GaSb, wherein the valence band edge of the electron barrier is graded by varying the thickness of the GaSb layer.

In still yet another embodiment, the detector of the invention includes an absorber layer superlattice where the period varies such that the band gap of the absorber layer is graded such that one or both the valence band edge or conduction band edge between said absorber superlattice and said unipolar barrier are smoothly bridged. In one such embodiment, the absorber layer and contact layer are formed from InAs/InAsSb superlattices having identical composition but different period. In another such embodiment the unipolar barrier is an electron blocking unipolar barrier formed from a four-layer superlattice comprising AlSb/AlAs/AlSb/GaSb, a 3-layer AlSb/AlAs/GaSb superlattice, or an AlSbAs alloy.

In still yet another embodiment, the detector of the invention includes a plurality of supercells formed from two semiconductor materials, where said two semiconductor materials are chosen such that the lattice constant of the first semiconductor material is smaller than the substrate lattice constant such that when disposed on said substrate the first material is under a tensile strain, and wherein the lattice constant of the second semiconductor material is larger than the substrate lattice constant such that when disposed on said substrate the second material is under a compressive strain, and where the first and second material layer thicknesses are chosen such that the tensile and compressive strains counteract and balance each other to yield a minimally strained configuration in said superlattice.

BRIEF DESCRIPTION OF THE DRAWINGS

These and other features and advantages of the present invention will be better understood by reference to the following detailed description when considered in conjunction with the accompanying data and figures, wherein:

FIG. 18 provides a data plot of the peak quantum efficiency as a function of applied bias measured at temperatures of 78K, 150K, and 200K for a test device fabricated from the same wafer as the prototype focal plane array made in accordance with an embodiment of the current invention;

DETAILED DESCRIPTION OF THE INVENTION

The current invention is directed to barrier infrared detectors capable of operating in the mid-wavelength infrared and the long wavelength infrared. In particular, the current invention demonstrates a high-performance barrier infrared detector using novel superlattice materials as the infrared absorber and unipolar barrier layers, and, in some cases, as graded band gap transition layers. The detector structures of the invention show excellent material quality in focal plane arrays, and have cutoff wavelengths greater than 5 microns. In addition, they are extremely simple to manufacture when compared to current state of the art barrier detector materials.

Figure 2:
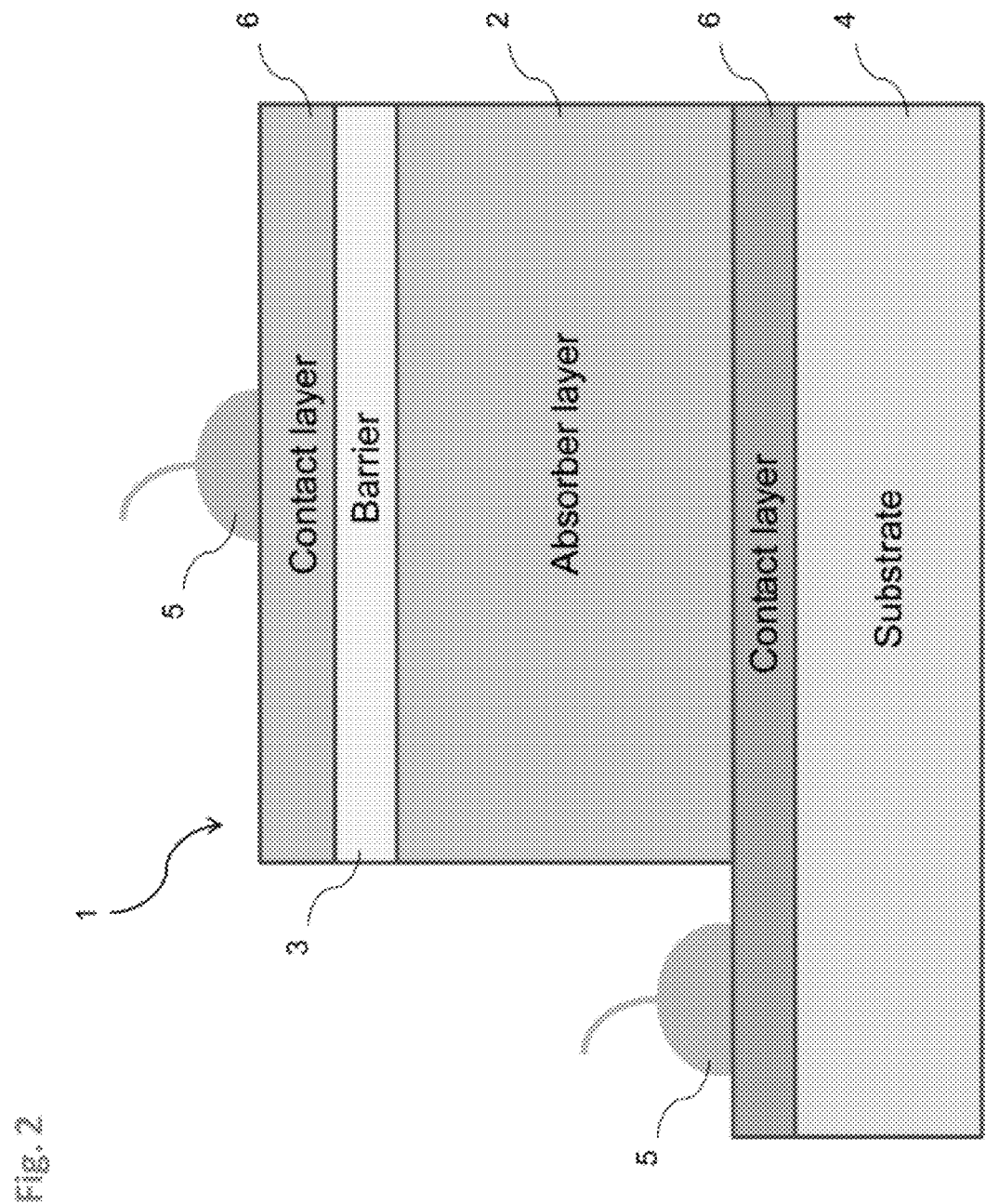
FIG. 2 provides a schematic of a barrier infrared detector.

As shown in FIG. 2, in its simplest form a barrier infrared detector (1) comprises at least one absorber layer (2) and at least one barrier (3) disposed on a substrate (4) and electrically connected to the necessary detector circuitry (5) through a pair of top and bottom contact layers (6). In the current invention, the detector structure has the following characteristics:

An absorber made from a superlattice (periodic structure) where each period (or supercell) consists of two or more layers of InAs, InSb, InSbAs, or InGaAs, and where the layer widths and alloy compositions are chosen to yield the desired energy band gap, absorption strength, and strain balance; and A unipolar barrier (either hole blocking or electron blocking) customized to operate with the specific superlattice absorber.

Optionally varying or "chirping" the periodicity of one or both the absorber or barrier layer superlattices to create materials with a graded energy band gap to provide better energy band matching.

Optionally containing broken gap tunnel junctions between GaSb and the absorber superlattice, or between GaSb and InAsSb layers.

As will be discussed in greater detail below, using these basic structures, it is possible to construct any suitable barrier infrared detector, including nBn, pBp, XBn, double heterostructure (DH), and the complementary barrier infrared detector (CBIRD) structure. In addition, absorbers with different detection cutoff wavelengths could be combined in the same detector structure to form a multi-band (multicolor) detector. The detector could also be used in a focal plane array for imaging and spectrometry applications.

The Absorber Layer

Figure 3:
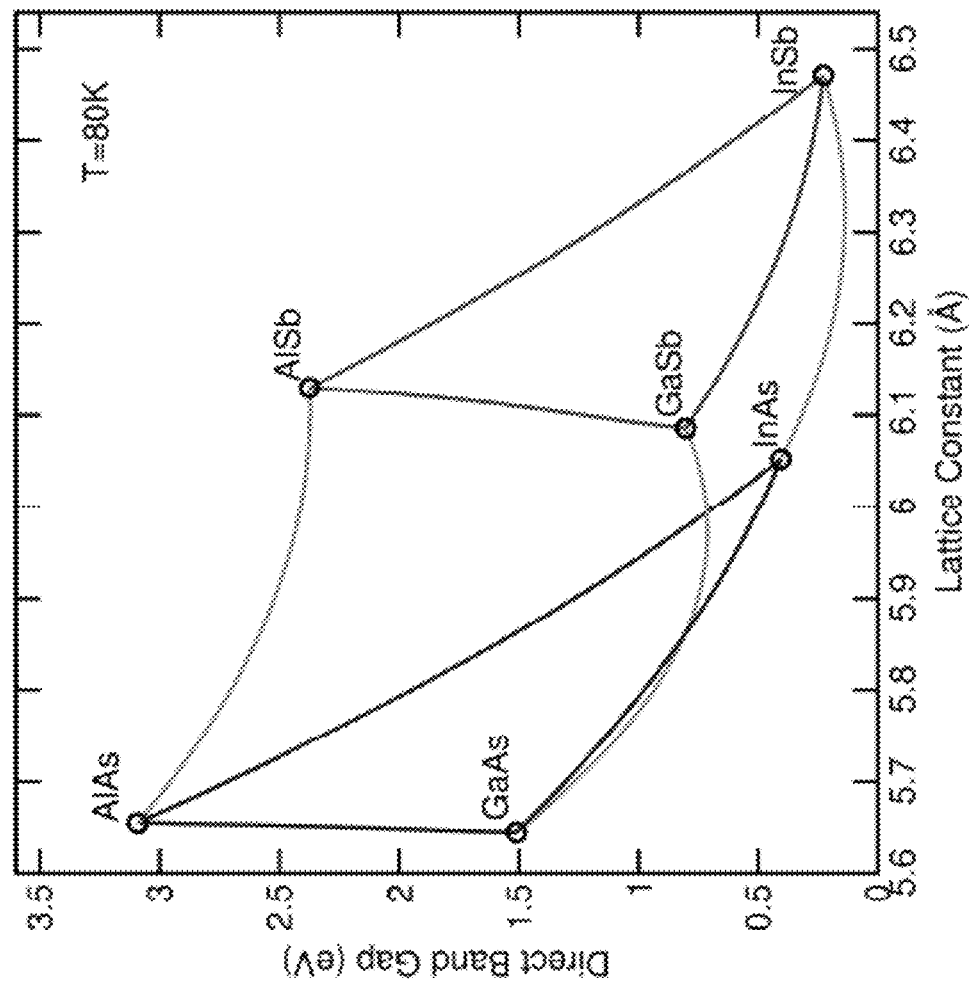
FIG. 3 provides a data graph showing the direct energy band gap plotted against lattice constant for antimonide, arsenide, and arsenide-antimonide III-V semiconductors.
Figure 4:
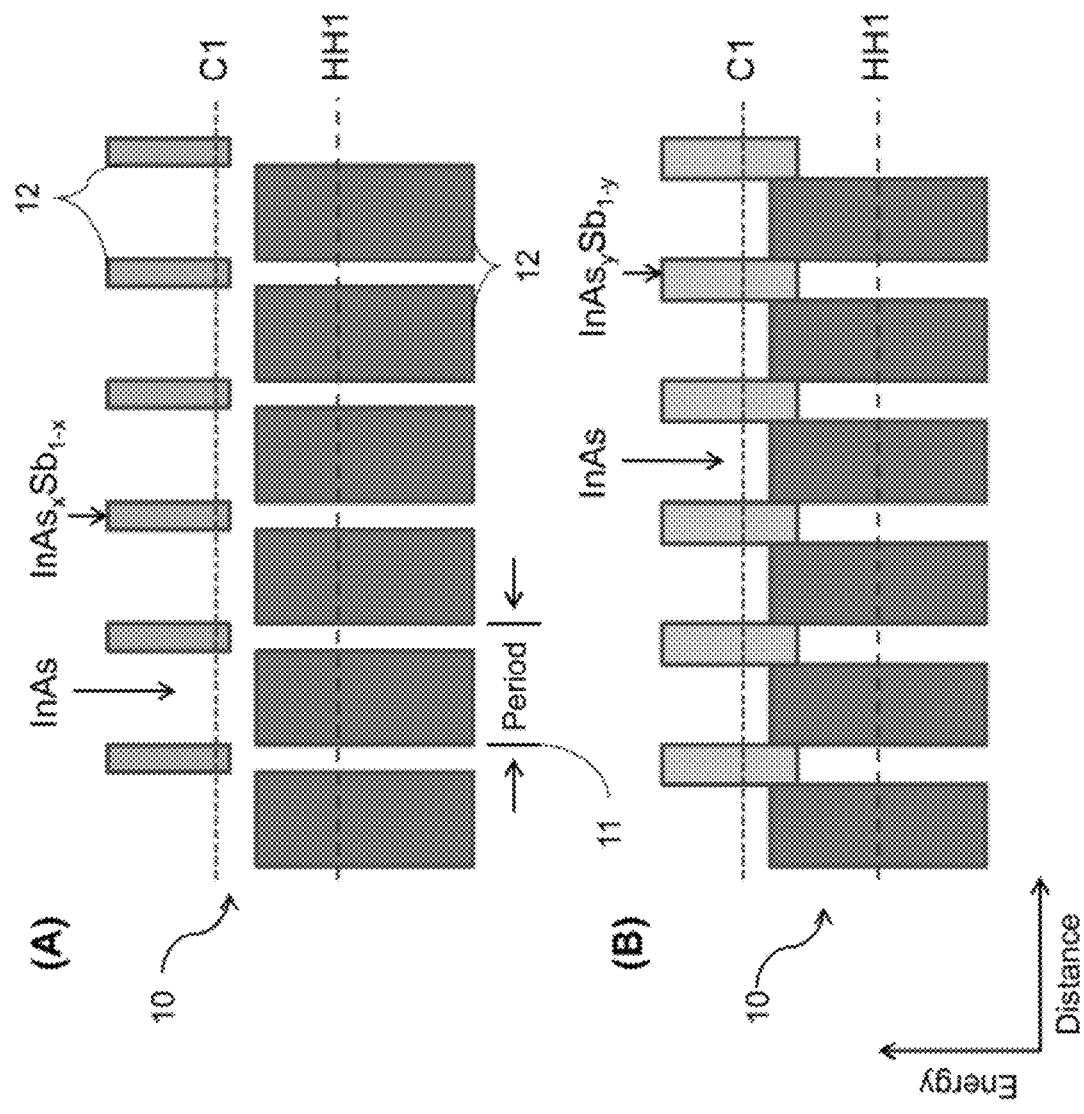
FIG. 4 provides a schematic of the energy band diagrams of two InAs/InAsSb superlattices, along with the C1 and HH1 energy levels of the superlattice, wherein the separation between the C1 and HH1 levels indicates the size of the superlattice band gap, the two superlattices illustrated in (A) and (B) have the same periodicity, but the InAsSb alloy in (A) has higher antimony (Sb) content.

To understand the construction of the absorber layer in accordance with the instant invention, it is necessary to understand how and why the materials of the absorber layer were chosen. FIG. 3 shows the direct energy band gaps for the antimonide, arsenide, and arsenide-antimonide III-V semiconductors plotted against their lattice constants. Of particular interest are the InAsSb and InGaAs alloys (indicated by the curve connecting GaAs, InAs and InSb) and GaSb. GaSb is often used as a substrate on which detector structures are grown epitaxially. In the current invention, high quality epitaxial materials from along this curve are selected to allow for band gap structure tailoring and strain balancing, as exemplified by the superlattices depicted in FIGS. 4 and 6.

As shown schematically in FIG. 4a, a superlattice (10) for use as an absorber layer in the current invention generally comprises a plurality of supercells (11) each themselves comprising a plurality of thin layers (12) of semiconducting materials disposed on a substrate (not shown). As will be discussed with reference to an exemplary embodiment below, the layer widths and compositions within these supercells are chosen to yield a superlattice that has the desired band gap structure and a configuration that is minimally strained in relation to the underlying substrate.

Strain-Balancing the Structure

Figure 5:
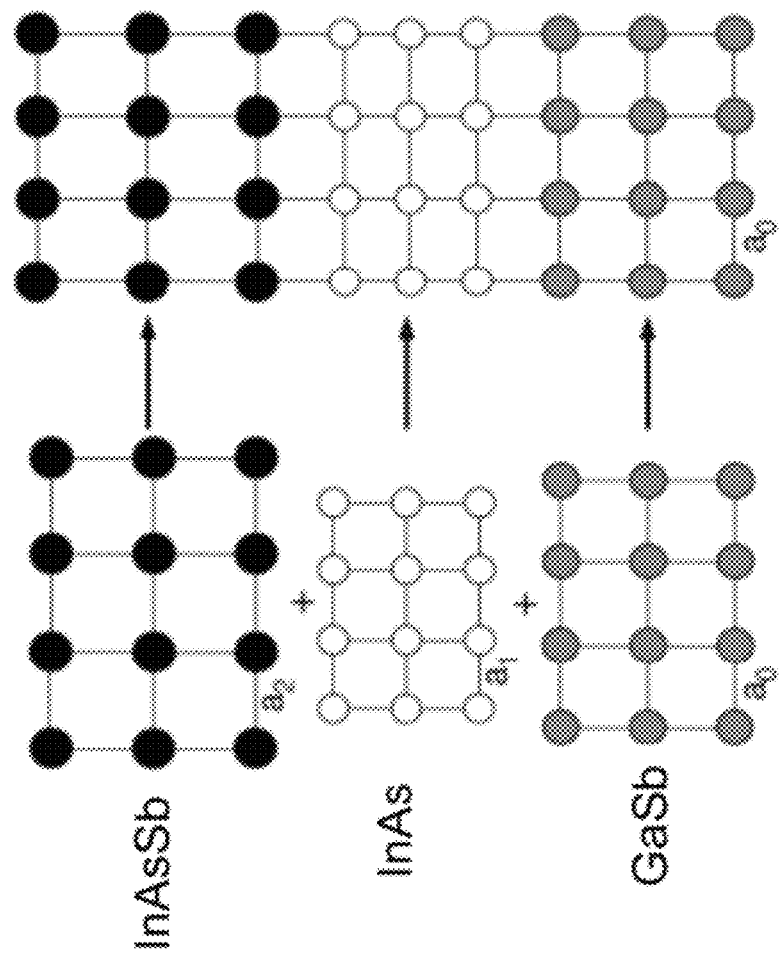
FIG. 5 provides a schematic of the lattice of a strain-balanced InAs/InAsSb superlattice on a GaSb substrate.

In tailoring the superlattice to obtain a minimally strained configuration several factors including the relative thicknesses of the individual layers making up each supercell, the overall thickness of the layers, and the composition of the layers must be taken into consideration. In particular, FIGS. 4a and 4b show exemplary InAs/InAsSb absorber superlattices (10) in accordance with the current invention. In this embodiment, the supercells (11) are formed from alternating thin layers (12) of InAs and InAsSb grown on GaSb substrate. In such an embodiment, the InAs has a smaller lattice constant than GaSb and therefore is under tensile strain. In turn the composition of InAsSb is chosen such that it has a larger lattice constant than GaSb, in accordance with the graph on FIG. 3, and hence the InAsSb layer is under compressive strain. In turn, the thicknesses and materials of each supercell of the absorber superlattice are chosen such that the tensile and compressive strains on the materials can counteract and balance each other to yield a minimally strained configuration. An approximate method to achieve strain balance is to choose the layer widths such that the average lattice constant (weighted by layer widths) is the same as the substrate lattice constant. A more precise strain-balancing scheme is given by the zero-stress method. (See, N. J. Ekins-Daukes et al., Crystal Growth and Design 2(4), 287-292, (2002), the disclosure of which is incorporated herein by reference.) As shown schematically in FIG. 5, the result of these strains is an adjustment in both the in-plane and growth directions of the lattice of these materials into a "strain-balance" configuration.

Although adjusting the thickness of the layers provides one possible degree of freedom in obtaining a strain-balanced superlattice, as previously discussed, both the period of the supercell and the composition of the layers effect the strain-balance configuration. For example, in the embodiments shown in FIGS. 4a and 4b, the two strain-balanced superlattices have the same periodicity, but the width of the InAsSb layer is smaller for the one in FIG. 4a because it uses an InAsSb alloy with high antimony (Sb) content (and hence has a larger lattice constant). Accordingly, it will be understood that by moving the compositional balance along the lines of the graph in FIG. 3 it is possible to tune the lattice constant of the material thereby allowing another degree of freedom in obtaining a strain-balance configuration.

Once a strain-balanced configuration is found, other strain-balanced configurations can be found by scaling, as illustrated in FIGS. 6a and 6b. Consider a strain-balanced superlattice consisting of alternating layers of InAs layers of width L and InAsSb layers of width M, denotes as (L,M)-InAs/InAsSb. Keeping the InAsSb alloy composition the same and scaling the layer widths by a constant factor "α" yields another strain-balanced structure (αL,αM)-InAs/InAsSb. Because the individual InAs and InAsSb layers are respectively under tensile and compressive strain, for each layer, there is a maximum or "critical" layer thickness that cannot be exceeded before material quality degrades, because beyond that thickness the material is no longer coherently strained and defects can form. For example, the critical thickness for the InAsSb layer depends on its composition. InAsSb with approximately 9% InSb content is lattice matched to the GaSb substrate. Beyond that, InAsSb has a larger lattice constant than GaSb, and InAsSb with higher Sb content has smaller critical thickness. Accordingly, it will be understood by one of ordinary skill in the art that it is necessary to determine and avoid this critical thickness for each material used.

Band Gap Structure Tailoring

Figure 6:
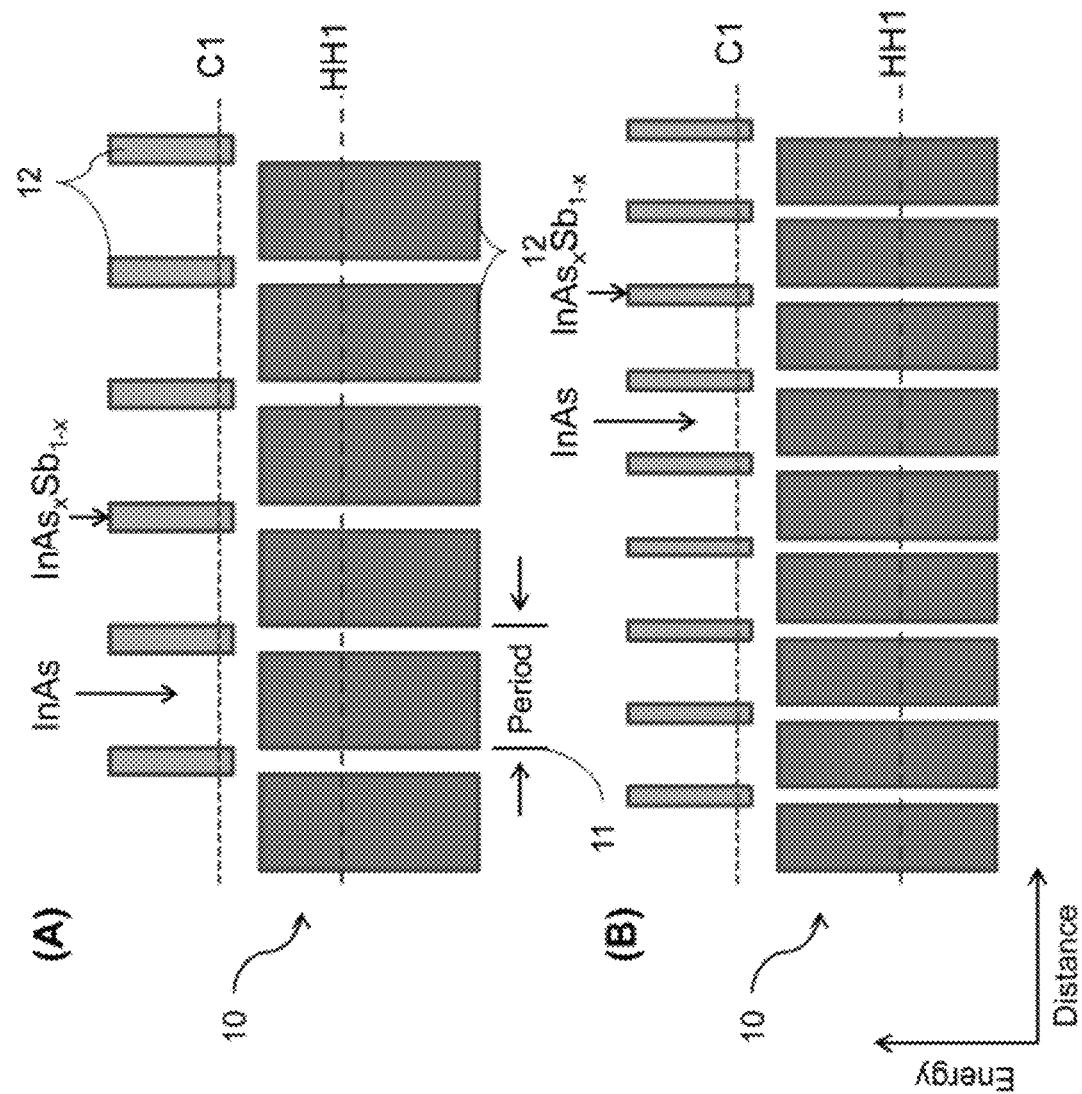
FIG. 6 provide schematic energy band diagrams of two InAs/InAsSb superlattices, along with the C1 and HH1 energy levels of the superlattice, where the InAsSb component of two superlattices illustrated in (A) and (B) has the same antimony (Sb) content, but the superlattice in (A) has a longer period, and the InAs to InAsSb width ratio is the same in both cases.
Figure 7:
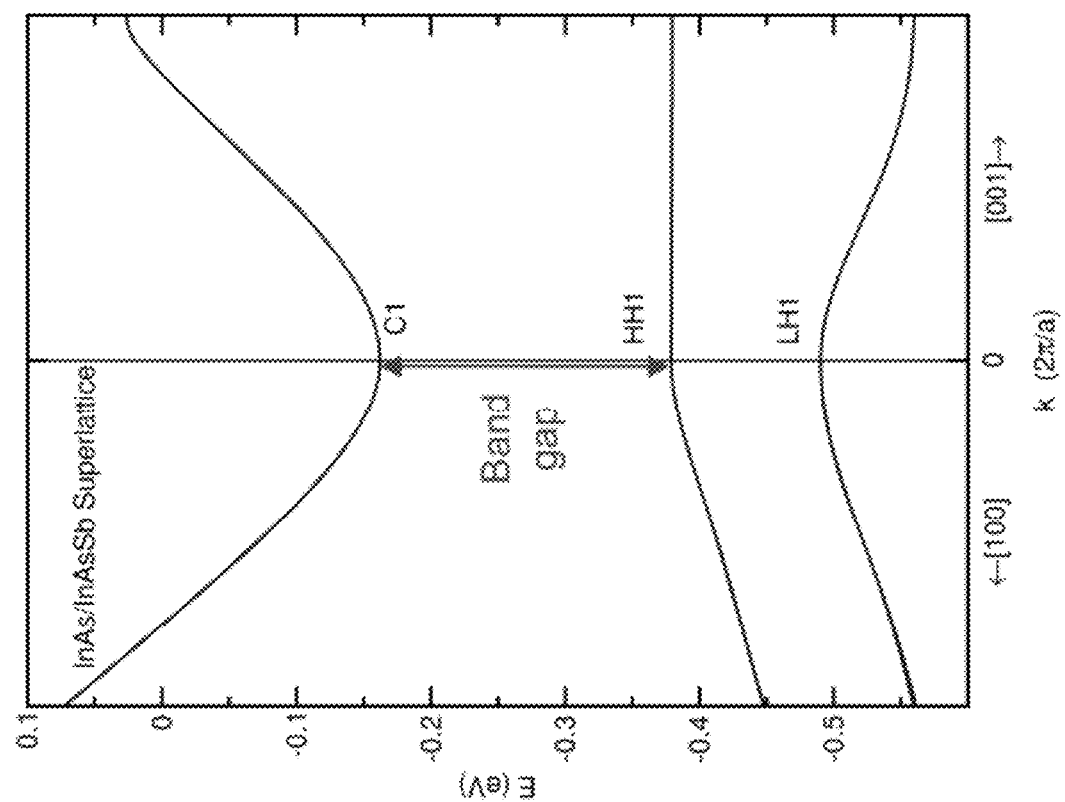
FIG. 7 provides a data graph of the calculated band structure of an InAs/InAsSb superlattice along the growth direction (right portion) and the in-plane direction (left portion), where the C1, HH1, and LH1 bands are shown.

In addition to allowing for the formation of a strain balance configuration, the superlattice of the instant invention also allows for the tailoring of the band gap structure of superlattice. In particular, FIG. 7 shows the calculated band structure of a typical strain-balanced InAs/InAsSb superlattice. It shows the energy-momentum dispersion along the superlattice growth direction and an in-plane direction. As shown in this figure, the band gap structure, within the meaning of the instant invention, refers to the combination of the lowest conduction subband (C1), the highest heavy-hole subband (HH1) and the highest light-hole subband (LH1), the superlattice energy bandgap, which is given by the separation of the C1 and HH1 bands at the zone center (k=0), and the band edge positions of the C1 and HH1 bands. One feature revealed by the band structure in FIG. 6 is that, along the growth direction, the C1 band is much more dispersive than the HH1 band. Since carrier group velocity is given by:

$$v = \nabla_k E(k)/\hbar,$$ (EQ. 1)

where E(k) describes the band structure, one would expect the electron mobility to be much better than hole mobility along the growth direction.

Figure 8:
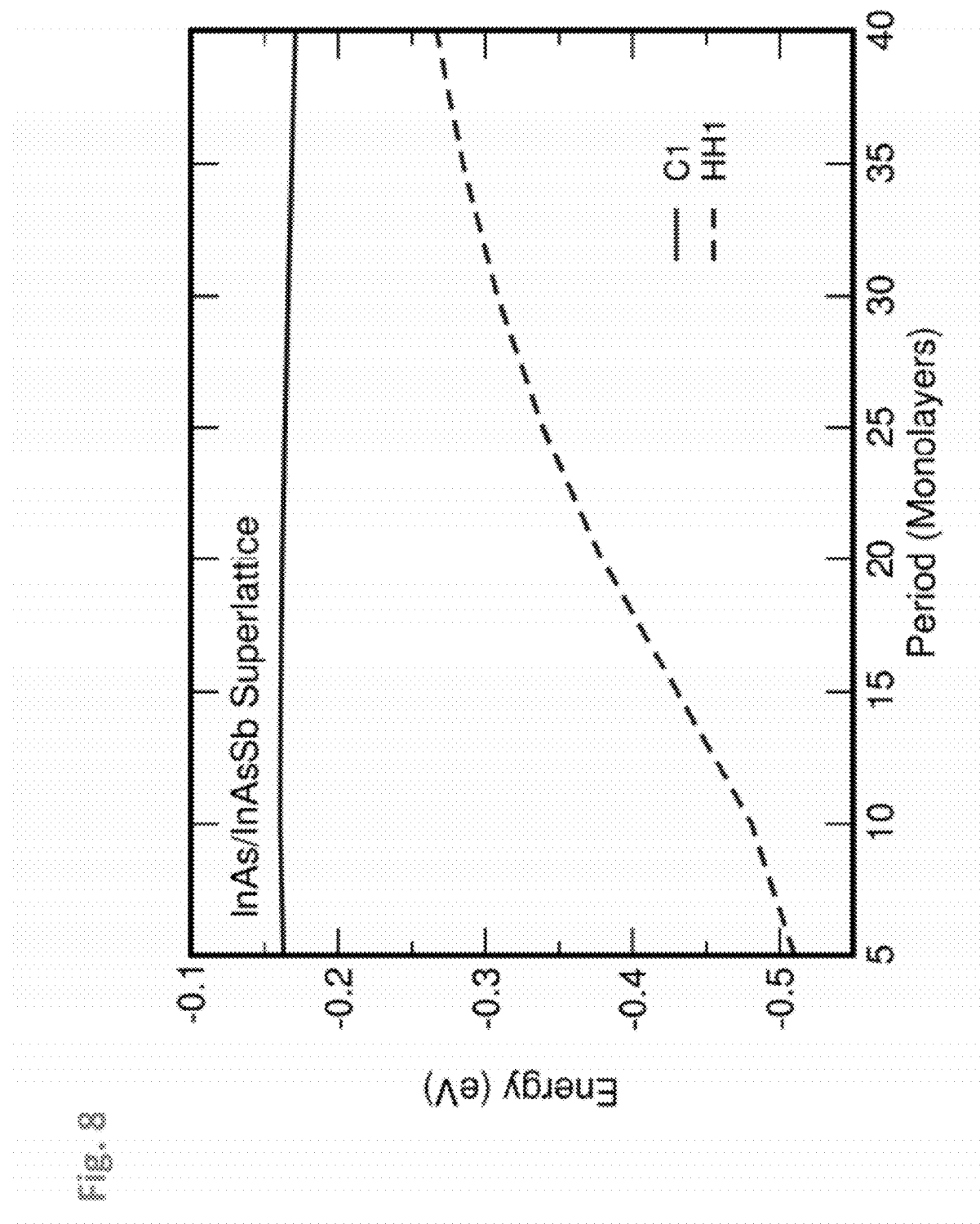
FIG. 8 provides a data graph of a calculated conduction band (C1) and valence band (HH1) edge positions for a set of strain-balanced InAs/InAsSb superlattices as functions of the superlattice period (in monolayers), where the layer width ratio (InAs width to InAsSb width) for each period of the superlattice, as well as the InAsSb alloy composition, is the same for all structures.

FIG. 8 shows how the band gap structure for a material can be tailored depending on the thickness and composition of the supercells. In particular, the data graph in FIG. 8 provides the calculated conduction band (C1) and valence band (HH1) edge positions for a set of strain-balanced (αL,αM)-InAs/InAsSb superlattices as functions of the superlattice period, given by $$P = \alpha L + \alpha M$$ (EQ. 2).

Figure 9:
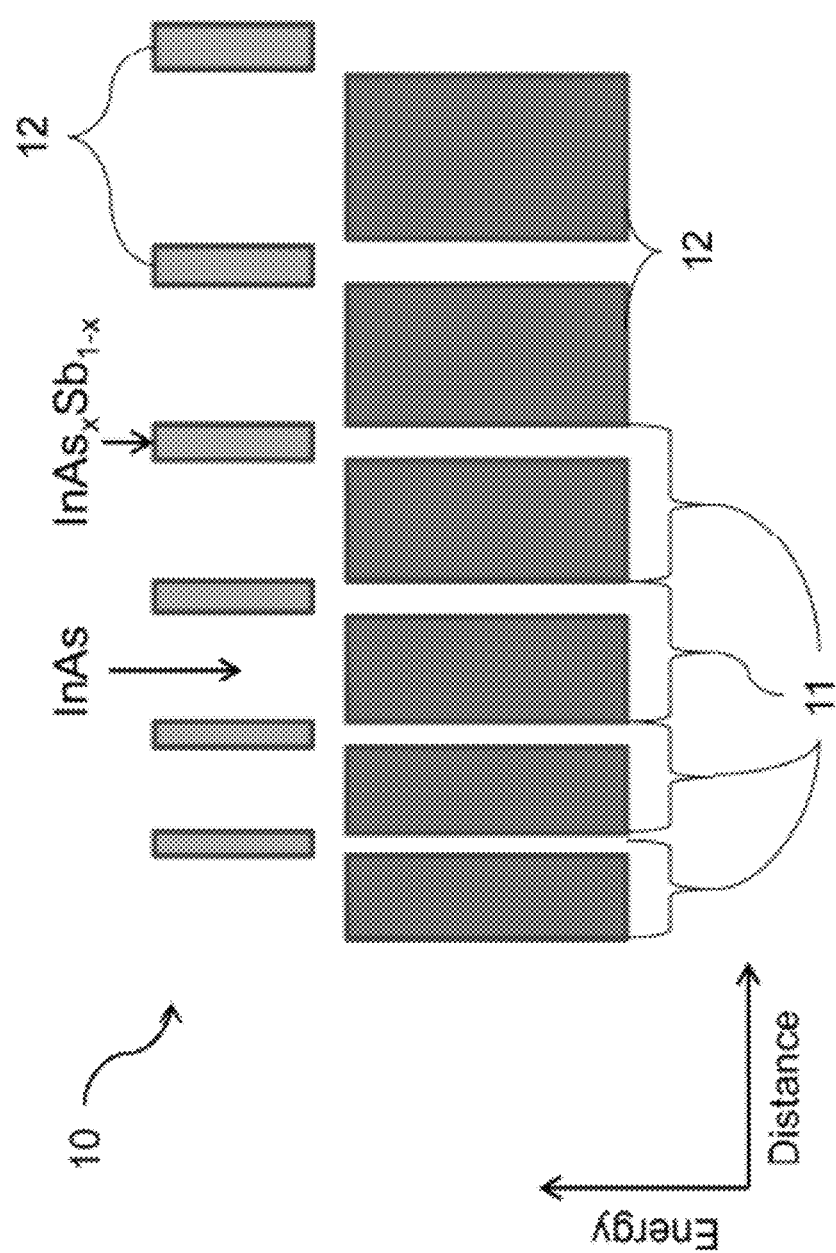
FIG. 9 provides a schematic energy band diagrams of a graded-gap or chirped InAs/InAsSb superlattice, where the composition of the InAsSb alloy is the same throughout the structure, but the periodicity is gradually varied to produce a spatially varying energy band gap.

The period is shown in units of monolayers; in this case one monolayer (ML) is approximately 3 Å. All structures contain InAsSb layers with the same alloy composition. It is shown that that energy band gap (separation between the C1 and HH1 levels) decreases as the superlattice period, as determined by the supercell structures, increases. This suggests a simple method for constructing a grade-gap material in accordance with the current invention, where the periodicity of the (αL,αM)-InAs/InAsSb superlattice would be gradually varied by changing the value of α, but without changing the composition of the InAsSb alloy. An example of such a graded-gap (or chirped) superlattice is illustrated in FIG. 9.

One advantage of this method of forming a graded-gap material is simplicity in material growth. For instance, in growing a graded-gap InAs/InAsSb superlattice by molecular beam epitaxy, after proper calibration of the In, As, and Sb flux levels, it would be possible to keep the In and As sources on continuously, and turn the Sb source on and off with the proper timing sequence to produce the desired structure. This method of growth will be described in greater detail below.

While the above discussion has focused on the bilayer InAs/InAsSb absorber superlattice because of its simplicity, other closely related structures are also good candidates as infrared absorbers. One example is an InGaAs/InAsSb absorber superlattice. Adding gallium (Ga) to InAs results in a material with a smaller lattice constant; the InGaAs material would be under higher tensile strain when grown on GaSb substrate. This allows the use of InAsSb with higher antimony (Sb) content for strain-balancing. Superlattices with complex supercells containing more than two distinct layers are also possible. In general, each period (or supercell) of an absorber superlattice layer in accordance with the current invention could contain two or more layers of InGaAs, InAs, InAsSb, and InSb, with difference alloy compositions and layer widths. As described above, the layer widths and alloy compositions would be chosen to yield the desired energy band gap, absorption strength, and strain balance for the particular application.

Unipolar Barriers

Figure 1:
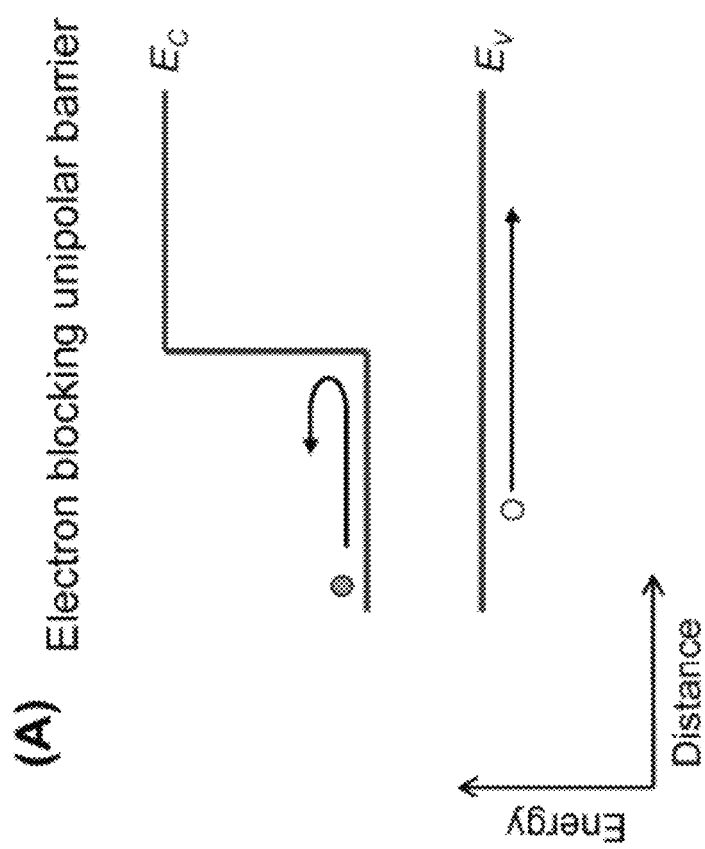
FIG. 1 provides a schematic illustration of the energy band diagrams show the conduction band edge ($E_C$) and valence band edge ($E_V$) of: (A) an electron-blocking unipolar barrier, and (B) a hole blocking unipolar barrier.

Although the above discussion has focused on the structure of the novel absorber superlattices in accordance with the current invention, it should be understood that the invention is also directed to novel unipolar barriers for use with these absorber superlattices. As described previously, a unipolar barrier is a heterostructure that can block one carrier type (electron or hole) but allows the substantially un-impeded flow of the other, as illustrated in FIG. 1. Below several embodiments of both hole and electron unipolar barriers for use with the absorber superlattices of the instant invention are described.

Hole Unipolar Barriers

As shown in FIG. 1a, a hole unipolar barrier is basically a heterostructure that is capable of blocking holes from a lower band gap layer to an adjacent higher band gap barrier layer, but that allows the unimpeded flow of electrons across said barrier.

With this in mind, one embodiment of a hole barrier in accordance with the current invention involves constructing a barrier superlattice having a shorter period than the absorber superlattice. As shown in FIG. 8, as the superlattice period varies, the conduction band (C1) edge changes considerably more slowly than the valence band (HH1) edge. Accordingly, a shorter-period superlattice would have a lower valence band edge than that of a longer-period superlattice, while having a substantially similar conduction band edge. The shorter-period superlattice could then act as a hole blocking unipolar barrier to the longer-period superlattice. If necessary a graded-gap region (such as that shown in FIG. 9) could be inserted to smoothly connect the shorter-period and the longer-period superlattices.

Figure 10:
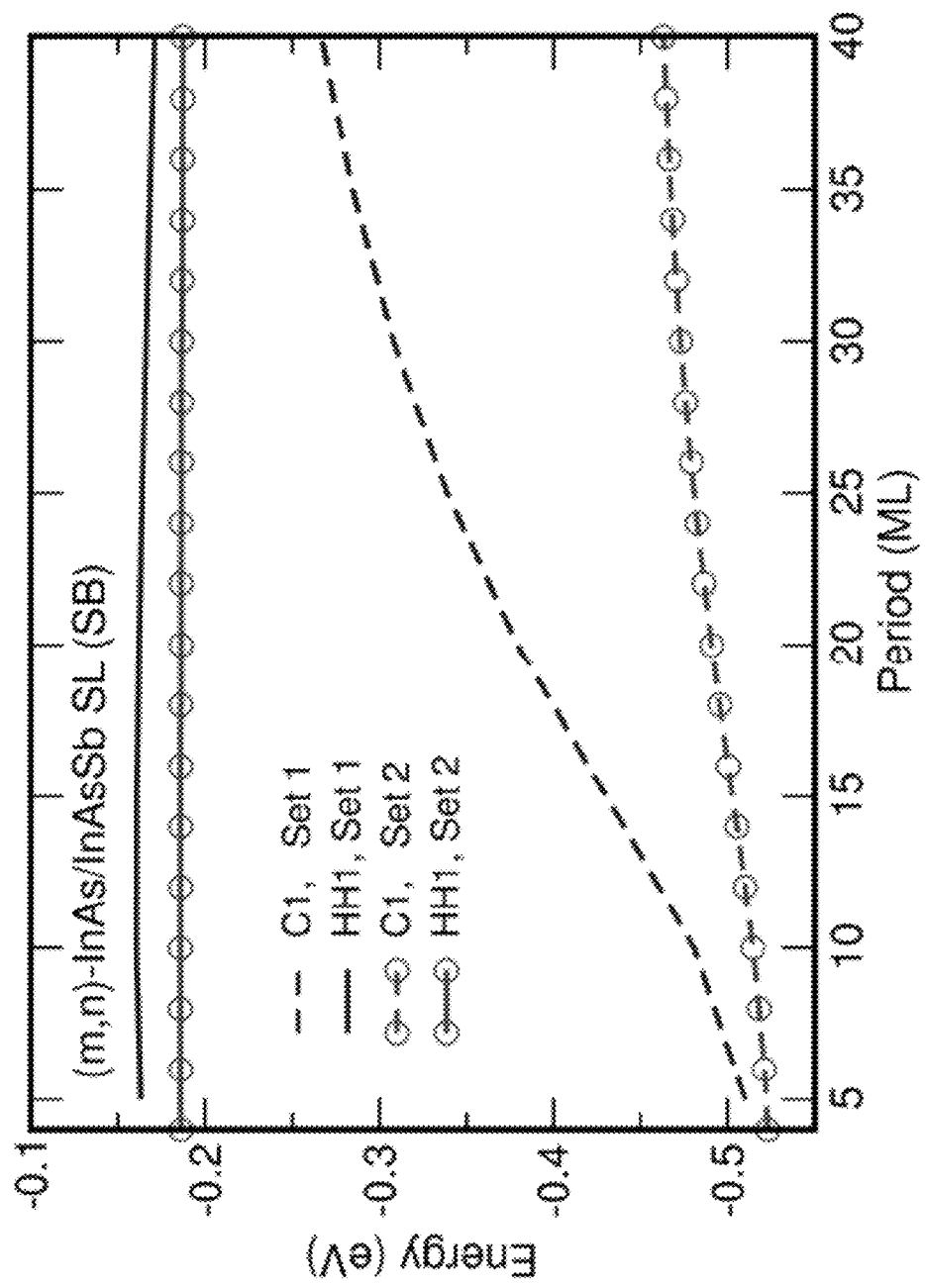
FIG. 10 provides a data graph of a calculated conduction band (C1) and valence band (HH1) edge positions for two sets of strain-balanced InAs/InAsSb superlattices as functions of the superlattice period (in monolayers), wherein within a given set, the layer width ratio (InAs width to InAsSb width) for each period of the superlattice, as well as the InAsSb alloy composition, is the same for all structures, and wherein the antimony (Sb) content of the InAsSb alloy in Set 1 is higher than that in Set 2.

Another embodiment for constructing a hole-blocking unipolar barrier for use with the absorbing superlattices in accordance with the current invention is shown by FIG. 10, where the calculated conduction band (C1) and valence band (HH1) edge positions for the same set of strain-balanced superlattices as in FIG. 8 are shown, but where the calculated results for a second set of superlattices constructed with InAsSb layers with lower Sb content have been added. As shown, the separation between conduction band (C1) edges of the two sets is typically considerably smaller than that between the valence band (HH1) edges. Therefore, a strain-balanced InAs/InAsSb superlattice can be used as a hole-blocking unipolar barrier to another strain-balanced InAs/InAsSb superlattice with InAsSb layers of higher Sb content. Again, a graded-gap region, as described above with reference to FIG. 9 could be introduced to substantially smooth out any discontinuities between the two regions.

Yet another embodiment for constructing a unipolar hole barrier to the InAs/InAsSb superlattice in accordance with the current invention uses the InAs/AlSb superlattice, where the widths of the InAs and AlSb layers are adjusted to yield substantial conduction band alignment with the InAs/InAsSb superlattice. Variations of the InAs/AlSb superlattice include the InAsSb/AlAsSb superlattice and the InAs/AlInSb superlattice, where the alloy compositions are adjusted to minimize overall strain (strain balancing) when grown on the GaSb substrate. The random alloys InAsSb, AlAsSb, and AlInSb in these barrier superlattices could also be replaced by corresponding digital alloys. (A fuller discussion of digital alloys is provided in U.S. Pat. Pub. No. 2010/0155777, the disclosure of which is incorporated herein by reference.) In general, these structures are more difficult to grow than the InAs/InAsSb superlattice based barriers described previously, but may have advantages such as larger electron effective mass for tunneling suppression.

Electron Unipolar Barriers

As shown in FIG. 1b, an electron unipolar barrier is basically a heterostructure that is capable of blocking electrons from a lower band gap layer to an adjacent higher band gap barrier layer, but that allows the unimpeded flow of holes across said barrier.

The simplest electron unipolar barrier for the typical InAs/InAsSb superlattice is either the AlAsSb or the AlGaSb ternary alloy. Over an alloy composition range with relatively high AlSb contents, the valence band edges of AlAsSb and AlGaSb can be adjusted (by changing alloy composition) to match those of the typical InAs/InAsSb superlattices of interest, while their band gaps provide substantial barriers to electrons. The limitation of these ternary alloys is that they each only have one adjustable parameter (namely the alloy composition), which cannot be tuned to simultaneously satisfy both the valence band edge matching and substrate lattice constant matching conditions. In practice, a compromise could be made between the two matching conditions. In particular, if the required barrier thickness is sufficiently small (below critical thickness), we can give higher priority to valence band matching, and still maintain good material quality.

In cases where thicker barriers are required, a solution to the simultaneous valence band and lattice matching problem is to use an AlGaAsSb quaternary alloy. The $AlAs_xSb_{1-x}$ at an alloy composition of approximately x=0.08 is lattice matched to the GaSb substrate. By mixing this particular lattice-matched AlAsSb alloy with GaSb it is possible to form a quaternary alloy AlGaAsSb that is also lattice-matched to GaSb. By tuning the mixing ratio, the valence band edge position of this lattice-matched quaternary alloy can then be adjusted to match the valence edge of the InAs/InAsSb superlattice of interest, and thus achieving lattice-matching and valence-band matching simultaneously.

However, in practice, growing the AlGaAsSb quaternary alloy at a specific composition can be challenging. A simpler method is to grow an AlAsSb/GaSb superlattice, using the lattice matched $AlAs_{0.08}Sb_{0.92}$ alloy. The valence band edge position of this superlattice can be easily adjusted by controlling the width of the GaSb layer (the valence band edge is relatively insensitive to the width of the AlAsSb layers), while the effective masses can be adjusted by controlling the AlAsSb layer width.

In the AlAsSb/GaSb superlattice, the random alloy AlAsSb itself can be replaced by an AlAs/AlSb digital alloy (or superlattice). At the approximately ratio of 1 monolayers (MLs) AlAs to 11 monolayers of AlSb, the digital alloy AlAs/AlSb is strain-balanced. It should be noted that since there is substantial difference between the lattice constant of AlAs and that of the GaSb substrate, the width of the AlAs layer should not substantially exceed 1 monolayer. Thin layers of GaSb can be inserted into the strain-balanced AlAs/AlSb digital alloy to form highly versatile digital alloy unipolar electron barriers.

One way to implement the digital alloy unipolar barrier is through a 3-layer per period AlSb/AlAs/GaSb or AlSb/GaSb/AlAs superlattice. A preferred method is to use a 4-layer per period AlSb/AlAs/AlSb/GaSb superlattice. The reason this is preferred over the seemingly simpler 3-layer superlattice implementations is that across each interface in this 4-layer superlattice there are always either common cations or common anions. This is in contrast to the 3-layer design, where both cation and anion species are changed at the AlAs—GaSb interfaces. The 4-layer simplifies material growth and could lead to higher material quality. An example of a 4-layer superlattice could comprise of repeating periods of, in sequence, 5 mL of AlSb, 1 mL of AlAs, 6 mL of AlSb, and 3 mL of GaSb. Note that the ratio of the total AlSb thickness to the AlAs thickness is designed to keep the structure strain-balanced when grown on the GaSb substrate.

In the 4-layer superlattice electron barrier, the position of the valence band edges is controlled primarily by the width of the GaSb layer. This suggests a method for constructing a graded-gap barrier in accordance with the invention, namely, by gradually vary the width of the GaSb layer from one 4-layer segment to the next. The resulting structure has a position dependent band gap, and, in particular, a position dependent valence band edge. This graded-gap electron blocking unipolar barrier would be useful for connecting two InAs/InAsSb superlattices with different band gaps. To summarize, the strain-balanced AlSb/AlAs/AlSb/GaSb superlattice has the following salient features:

It is lattice matched to the GaSb substrate;
It has an easily adjustable valence band edge;
It has a sufficiently large band gap to block electrons;
Its band gap, and valence band edge, can be spatially graded; and
It does not require the simultaneous switching of both cation and anion species across hetero-interfaces during growth.

Contact and Buffer Layers

Figure 11:
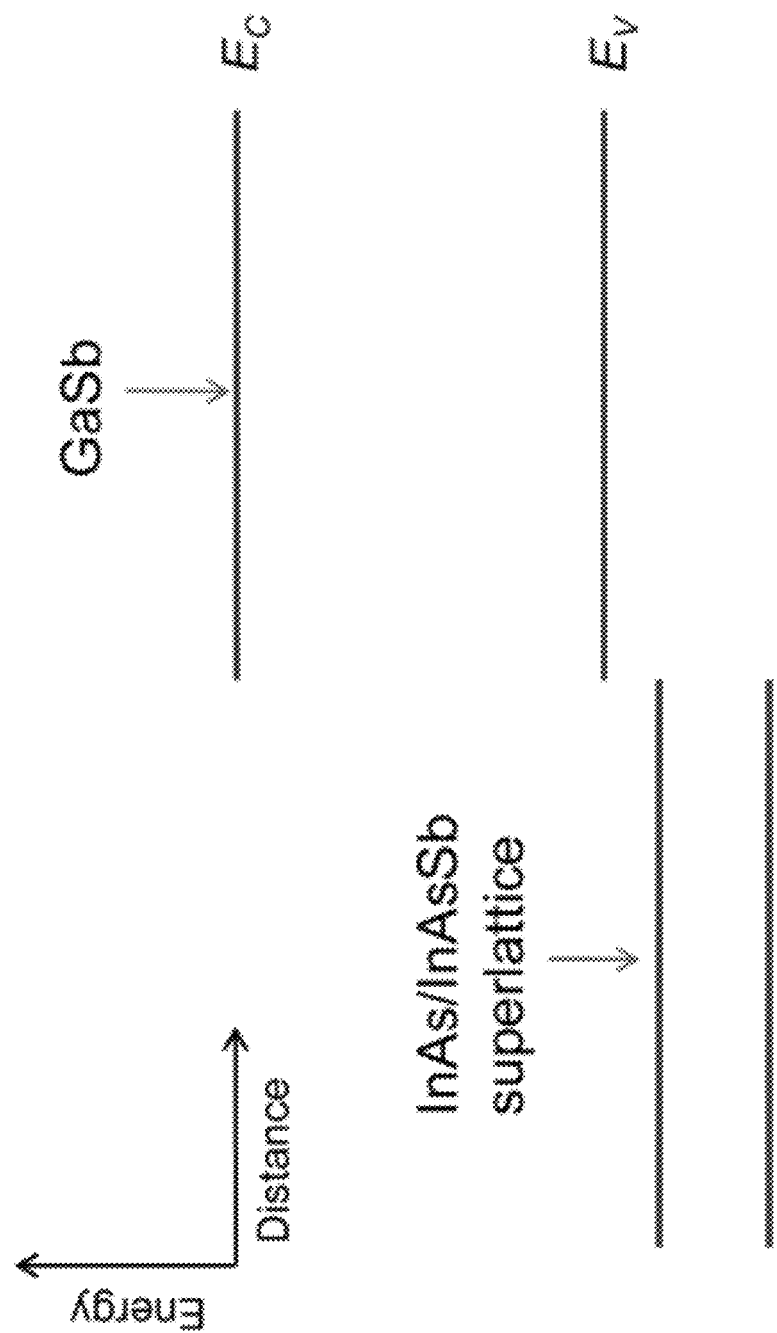
FIG. 11 provides a schematic illustration of the broken-gap energy band alignment between an InAs/InAsSb superlattice and GaSb.

Although in most applications it will be possible to provide contact layers formed of superlattices of the type already described above for the absorber layer and the barrier layers, and to place these into electrical contact with between the detector circuitry and the other functioning heterostructures, such as the barrier layers and absorber layers, it should be understood that other types of so-called "broken-gap junctions" contact and buffer layers may also be used with the absorber superlattices of the instant application. For example, the contact and buffer layers InAs and GaSb have a broken-gap band alignment, in which the valence band edge ($E_v$) of GaSb is higher than the conduction band edge ($E_c$) of InAs. Although the conduction band edge of a InAs/InAsSb superlattice is higher than that of bulk InAs, the superlattice quantization energy is typically sufficiently low such that a broken gap band alignment still exists, as illustrated in FIG. 11.

It is well-known that if InAs and GaSb are doped heavily n-type and p-type respectively near an InAs/GaSb interface, the junction resistance can be made to be very low because of the broken-gap band alignment. Similarly, the resistance of a broken-gap junction between an InAs/InAsSb superlattice and GaSb can also be made very low by proper doping. This broken-gap junction can be useful for building contact layers. Instead of contacting a superlattice layer direction, it is possible to grow a thick GaSb layer next to the superlattice layer, thereby forming a low-resistance broken-gap junction between them by proper doping, and contact the GaSb layer instead. This could have advantages for manufacturing because: (1) high quality thick GaSb layers are easy to grow on GaSb substrate, and (2) making contact to a thick GaSb layer would have higher device processing tolerance.

Substrates

The above discussion has focused on devices in which the substrate is unmodified GaSb, and where the inventive absorber layers and unipolar barriers are designed to be lattice matched to that unmodified GaSb substrate. However, it should be understood that the substrate may be a material selected from the group consisting of Si, GaAs, InP, InAs and modified GaSb. That further comprises a metamorphic buffer layer to modify the in-plane substrate lattice constant. In such a case, it will be understood that the absorber layers and unipolar barriers would be lattice matched to that modified substrate lattice.

Overview of IR Detector Toolkit

Figure 12:
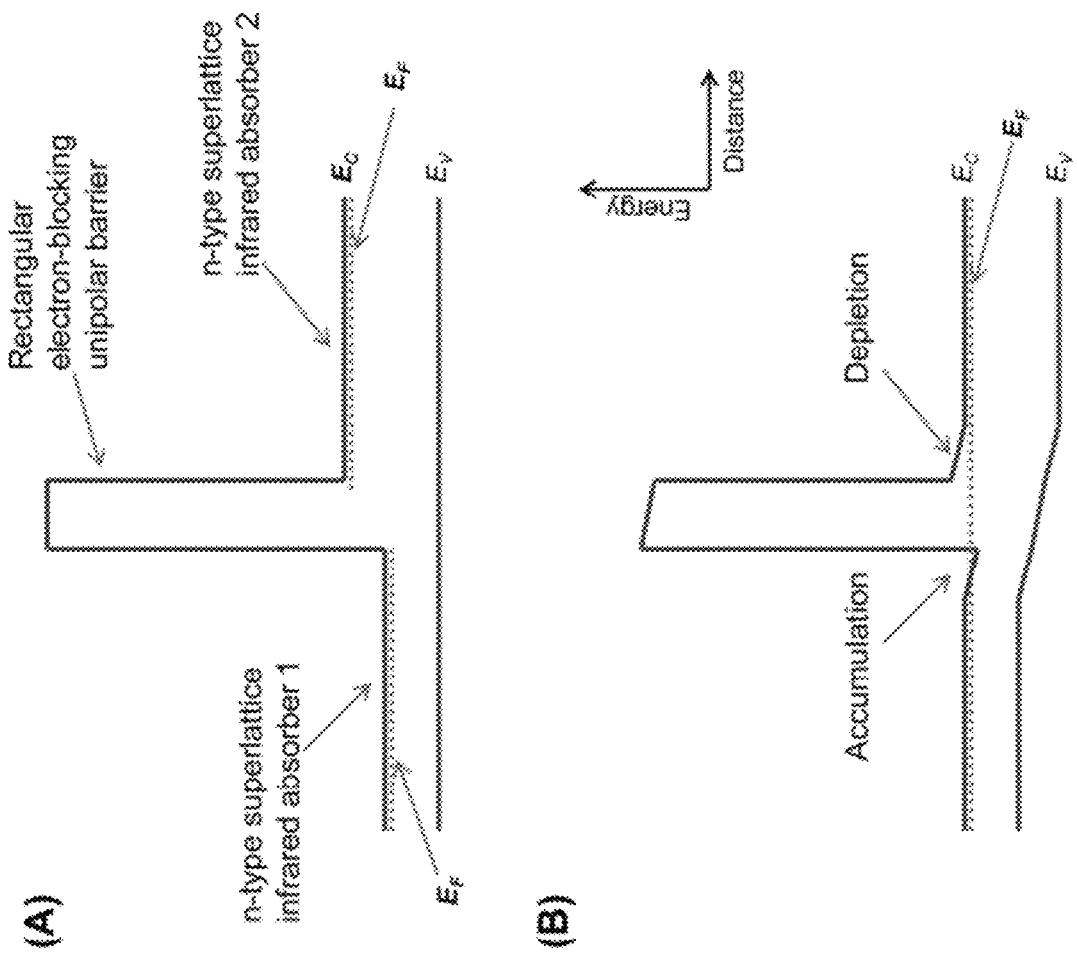
FIG. 12 provides a schematic illustration of the energy band diagram of a conventional dual-band nBn detector structure with a rectangular electron blocking unipolar barrier under flat-band condition (A), and under equilibrium condition (B)

To illustrate the utility of the graded-gap unipolar barriers, consider the case of the dual-band nBn detector. FIG. 12A shows the schematic energy band diagram of a standard bias-switachable dual-band nBn detector under flat-band conditions. The device structure consists of a rectangular barrier sandwiched between two n-type absorber materials with different energy band gaps. The selection criteria for the two absorbers materials are very stringent. Both absorber materials must be strain-balanced or lattice-matched with respected to the substrate material to ensure good material quality, and their valence band edges must be in very close agreement with that of the electron barrier to allow un-impeded minority carrier (hole) transport in both directions. Furthermore, their energy band gaps must be selected so as to yield detection cutoff wavelengths dictated by the application. In addition, the barrier material itself must also be reasonably lattice-matched or strain-balanced with respect to the substrate material.

Simultaneously satisfying all these requirements often demands very complex material combinations that can be challenging for material growth. For instance, as disclosed by Scott et al. in US2011/0037097 A1, in a dual-band nBn structure where the absorber material selected for one of the color bands is the lattice-matched InAsSb (alloy composition selected for lattice-matching to GaSb substrate), the absorber material for the other color band is an InGaAsSb/InAsSb superlattice, a GaAs/InGaAsSb superlattice, or an InGaAsSb/InSb superlattice, all of which need to be strain-balanced, valence-band-edge-matched, and cutoff-wavelength-tuned by carefully controlling the composition and layer width of the complex quaternary alloy InGaAsSb.

Another aspect of the standard dual-band nBn detector is revealed by comparing its flat-band energy diagram in FIG. 12A with its equilibrated energy band diagram under zero bias in FIG. 12B. The flat-band energy band diagram shows valence band edge alignment, with the Fermi level ($E_F$) of the wider gap absorber (Absorber 2) higher than that of the narrower gap absorber (Absorber 1). To reach equilibrium conditions where the Fermi level ($E_F$) is lined-up throughout the entire structure, some electrons are transferred from the wider-gap side to the lower-gap side, leaving in the vicinity of the barrier electron accumulation in Absorber 1 and electron depletion in Absorber 2.

Figure 13:
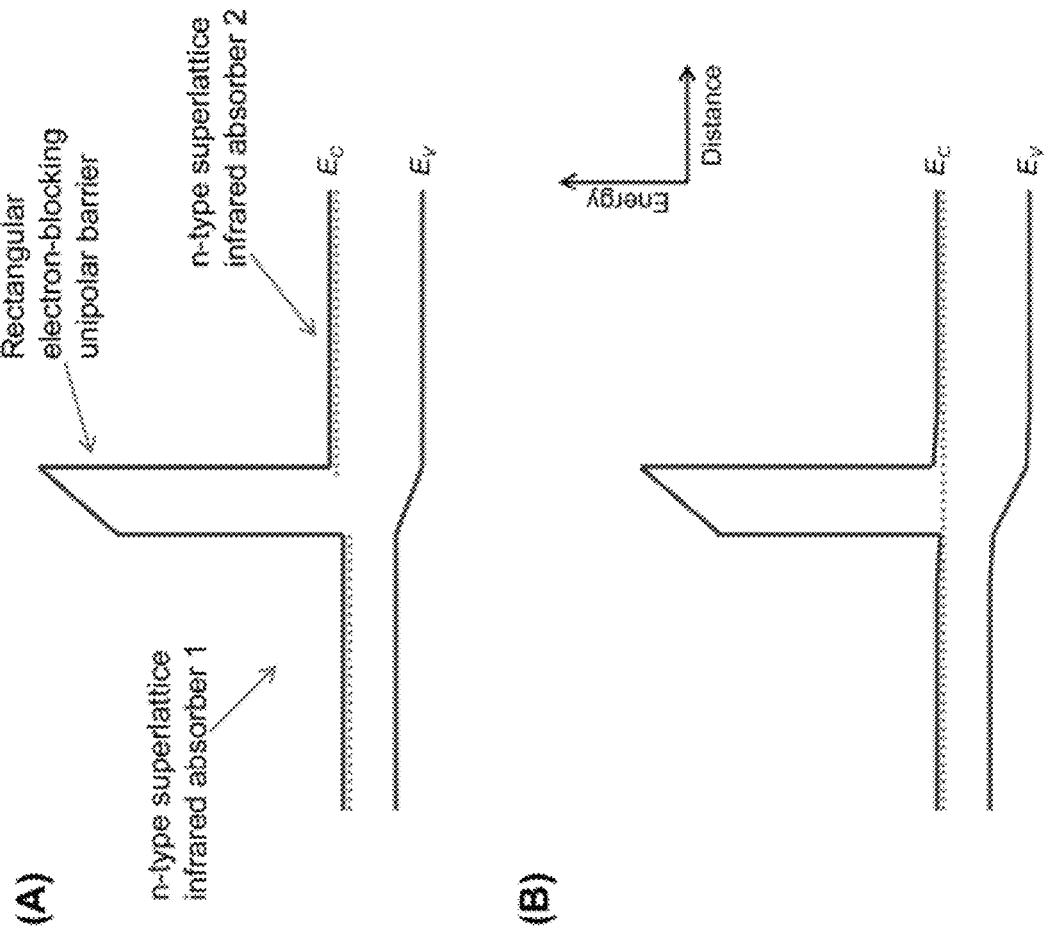
FIG. 13 provides a schematic illustration of the energy band diagram of a dual-band nBn detector structure with a grade-gap electron blocking unipolar barrier under flat-band condition (A), and under equilibrium condition (B) made in accordance with an embodiment of the current invention.

In FIG. 13 a new type of dual-band nBn detector structure is shown that could be constructed in a simpler manner using the design elements disclosed in the current invention. It has already been described how strain-balanced InAs/InAsSb superlattices with adjustable cutoff wavelength can be grown easily. However, as described in reference to FIG. 8 and FIG. 10, in general two InAs/InAsSb superlattices with distinct band gaps would have closer alignment in their conduction band edges rather than in valence band edges. This valence band edge misalignment eliminates the possibility of using a rectangular electron barrier (with constant valence band edge). Aligning the valence edge of the rectangular electron barrier with one of the absorbers inevitably introduces an unwanted hole barrier at the interface of the electron barrier and the second absorber, which can impede hole transport. However, as shown in flat-band energy diagram in FIG. 13A, the misaligned valence band edges of the two absorbers can be bridged smoothly using one of the graded-gap unipolar barriers (e.g., the strain-balanced AlSb/AlAs/AlSb/GaSb superlattice with a graded gap).

In the case of the dual-band nBn detector with the graded barrier, when the conduction band edges of the two absorber materials are closely alignment, which is likely to be the case with InAs/InAsSb superlattice absorbers, charge transfer (and hence electron accumulation and depletion) is minimal under equilibrium conditions. In general, minimizing carrier accumulation and depletion in the absorber regions is favorable for reducing generation-recombination dark current.

In short, the general approach of the current invention is to introduce a "toolkit" with a rich set of compatible components that can be integrated in the design of advanced infrared detector structures. The key components include minimally strained infrared absorbers, unipolar hole barriers, unipolar hole barriers, and the techniques to adjust or grade their band edge positions. The graded-gap barrier based dual-band nBn detector described above provides an illustrative case. The next section provides additional examples.

Although specific combinations are described herein, it should be noted that the components of the "toolkit" described in this invention could also be combined with other known components (e.g., absorbers based on InAs/GaInSb superlattice, or bulk InAsSb lattice matched to GaSb) for the purpose of making infrared detectors. For example, the InAs/InAsSb superlattice absorber and the AlSb/AlAs/AlSb/GaSb graded electron barrier could be combined with lattice-matched bulk InAsSb absorber to make a dual-band nBn detector.

Exemplary Embodiments

In this section several examples of how barrier infrared detectors could be implemented using the absorbers and barriers described earlier are provided. In addition, the performance of an MWIR nBn detector made in accordance with the current invention is provided. The person skilled in the art will recognize that additional embodiments according to the invention are contemplated as being within the scope of the foregoing generic disclosure, and no disclaimer is in any way intended by the foregoing, non-limiting examples.

As discussed earlier, the recent emergence of barrier infrared detectors such as the nBn-type and the XBn-type have resulted in mid-wave infrared (MWIR) detectors with substantially higher operating temperatures than previously available in III-V semiconductor based MWIR detectors. The initial nBn devices used either an InAs absorber grown on an InAs substrate, or a lattice-matched InAsSb alloy grown on a GaSb substrate, resulting in cutoff wavelengths of ~3.2 micron and ~4 micron, respectively. While these detectors could operate at much higher temperatures than existing MWIR detectors based on InSb, their spectral range does not cover the full MWIR atmospheric transmission window (3-5 micron). There have also been nBn detectors based on the InAs/GaSb type-II superlattice absorber. Although these InAs/GaSb superlattice based detectors have sufficiently long cutoff wavelength to cover the 3-5 micron atmospheric transmission window, they have not achieved very high performance levels. Lastly, while digital alloys based on periodic insertions of thin layers of InSb into InAs or InAsSb hosts have been proposed (and demonstrated) as absorbers for barrier infrared detectors, and while these types of digital alloy based barrier infrared detectors have exhibited extended cutoff wavelengths, they still have limited spectral range.

Example 1 nBn Detector Performance Testing

Figure 14:
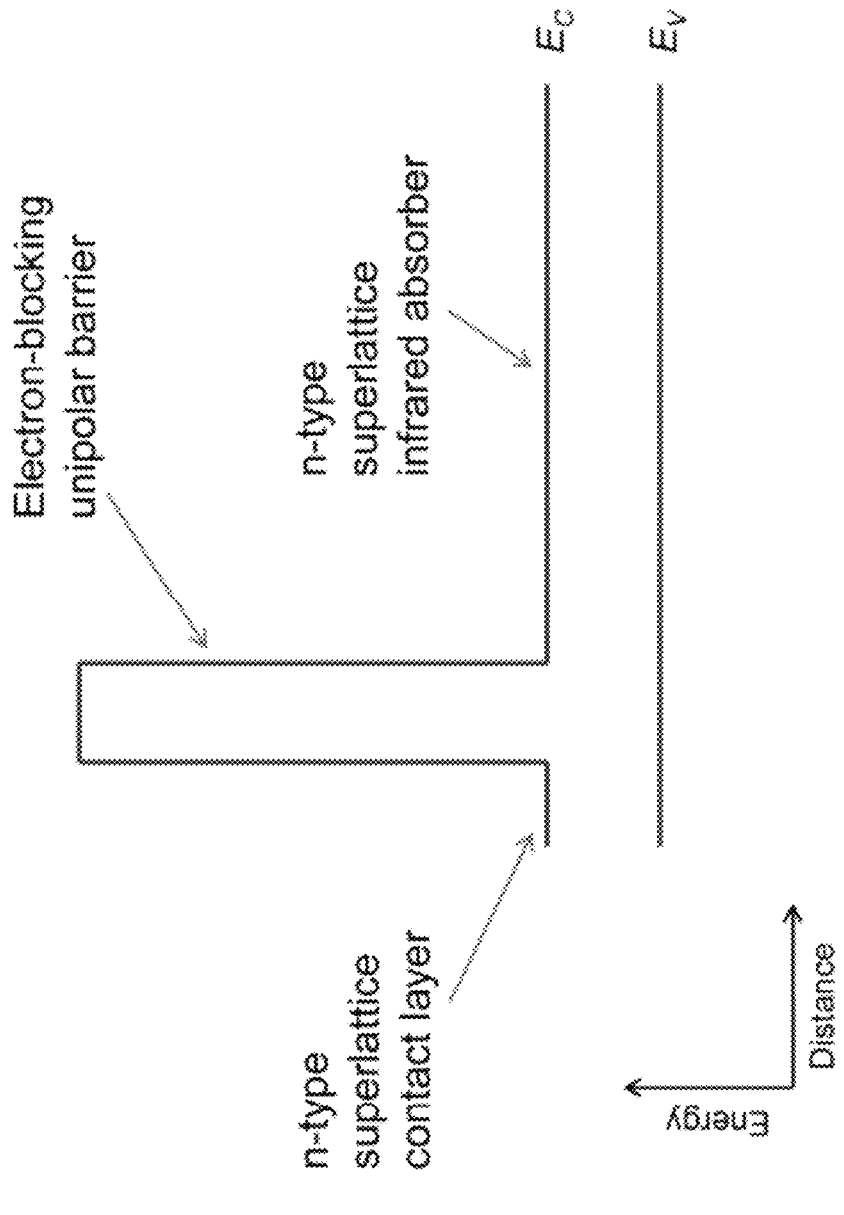
FIG. 14 provides a schematic illustration of the energy band diagram of an nBn detector structure showing the conduction band edge ($E_C$) and valence band edge ($E_V$)

FIG. 14 shows the schematic energy band diagram of on exemplary embodiment of a high-performance barrier infrared detector in accordance with the current invention, using a strain-balanced n-type InAs/InSbAs superlattice as the infrared absorber and the top contact layer, and a matching AlAsSb electron blocking unipolar barrier. The detector shows excellent material quality (FIG. 15), covering the key infra-red atmospheric transmission window of between 3 and 5 microns having cutoff wavelengths of greater than 5.3 microns (FIG. 16), and has excellent dark current characteristics operating at 150 K.

Figure 15:
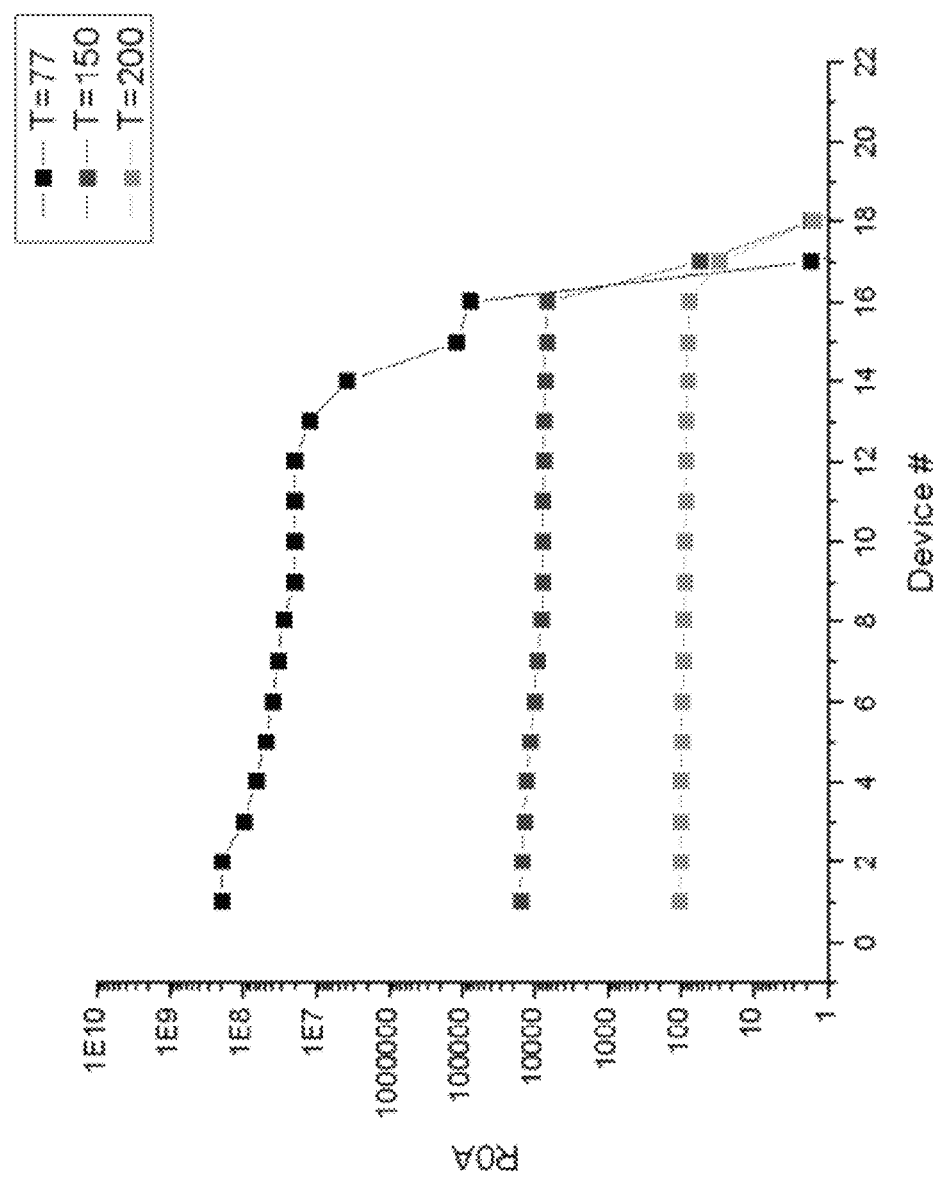
FIG. 15 provides a data plot of the zero-bias differential resistance-area product ($R_0A$), in units of ohm-cm$^2$, measured at temperatures of 77K, 150K, and 200K of a set of nBn barrier infrared detectors in accordance with an embodiment of the invention with a strain-balanced InAs/InAsSb infrared absorber and an AlAsSb unipolar barrier.
Figure 16:
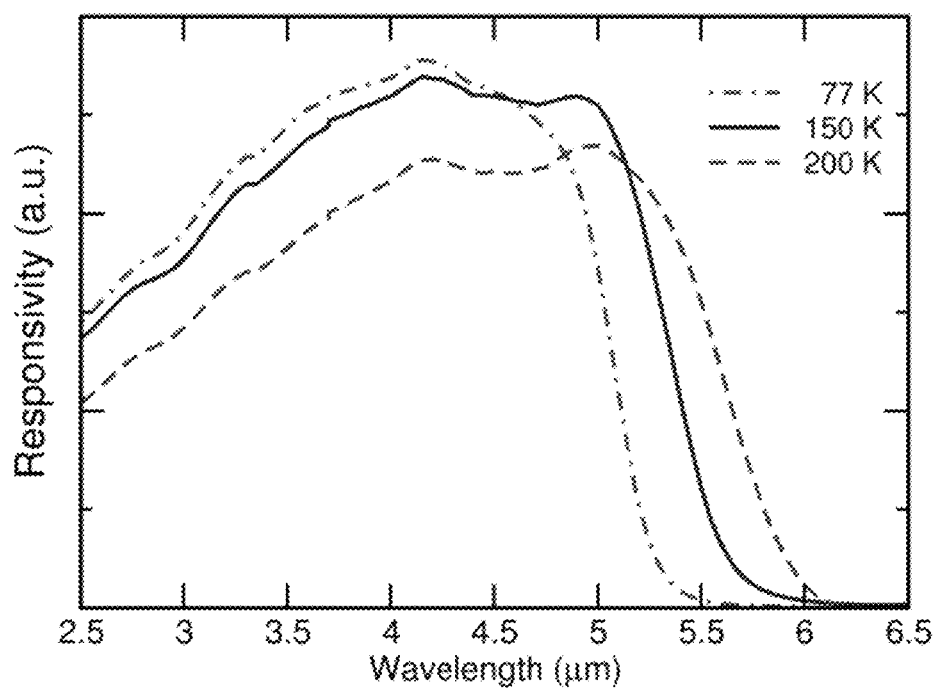
FIG. 16 provides a data plot of the spectral response measured at temperatures of 77K, 150K, and 200K of an nBn barrier infrared detector with a strain-balanced InAs/InAsSb infrared absorber and an AlAsSb unipolar barrier made in accordance with an embodiment of the current invention.

In particular, FIG. 15 provides a rank plot (of 18 devices) made in accordance with the current invention. As shown, the plot shows the devices have a RoA (zero bias differential resistance-area product) ~10,000 ohm-cm$^2$ at a temperature of T=150K, and that most of the large-area 200 μm×200 μm devices are free of defects. The lack of defects provides excellent evidence for the suitability of the devices of the instant invention for high pixel operability, high pixel-to-pixel uniformity focal plane arrays. FIG. 16, meanwhile provides data from a single element high operating temperature-MWIR detector made in accordance with the current invention. As shown, the device has a 5.3 μm cutoff, very low dark current density at T=150K, and has spectral coverage of the entire MWIR atmospheric transmission window.

Figure 17:
FIG. 17 provides infrared images taken at operating temperatures of 150K, 170K, 180K, and 190K with a prototype focal plane array fabricated from an nBn barrier infrared detector containing a strain-balanced InAs/InAsSb infrared absorber and an AlAsSb unipolar barrier made in accordance with an embodiment of the current invention, and having a temperature-dependent cutoff wavelength of 5.3 microns at 150K and 5.7 microns at 200K.

A detector material of this design has been made into prototype focal plane arrays. FIG. 17 provides images taken from a prototype focal plane array operating at operating temperatures of 150K, 170K, 180K, and 190K. As shown, the cutoff wavelength of this detector material is 5.3 micron at 150K, and 5.7 micron at 200K. FIG. 18 shows the peak quantum efficiency as a function of applied bias measured at temperatures of 78K, 150K, and 200K for a test device fabricated from the same wafer as the prototype focal plane array. The plot indicates that the detectors made in accordance with the invention can become responsive under relatively low biasing conditions.

Example 2

Dual-Band nBn Detector

Figure 19:
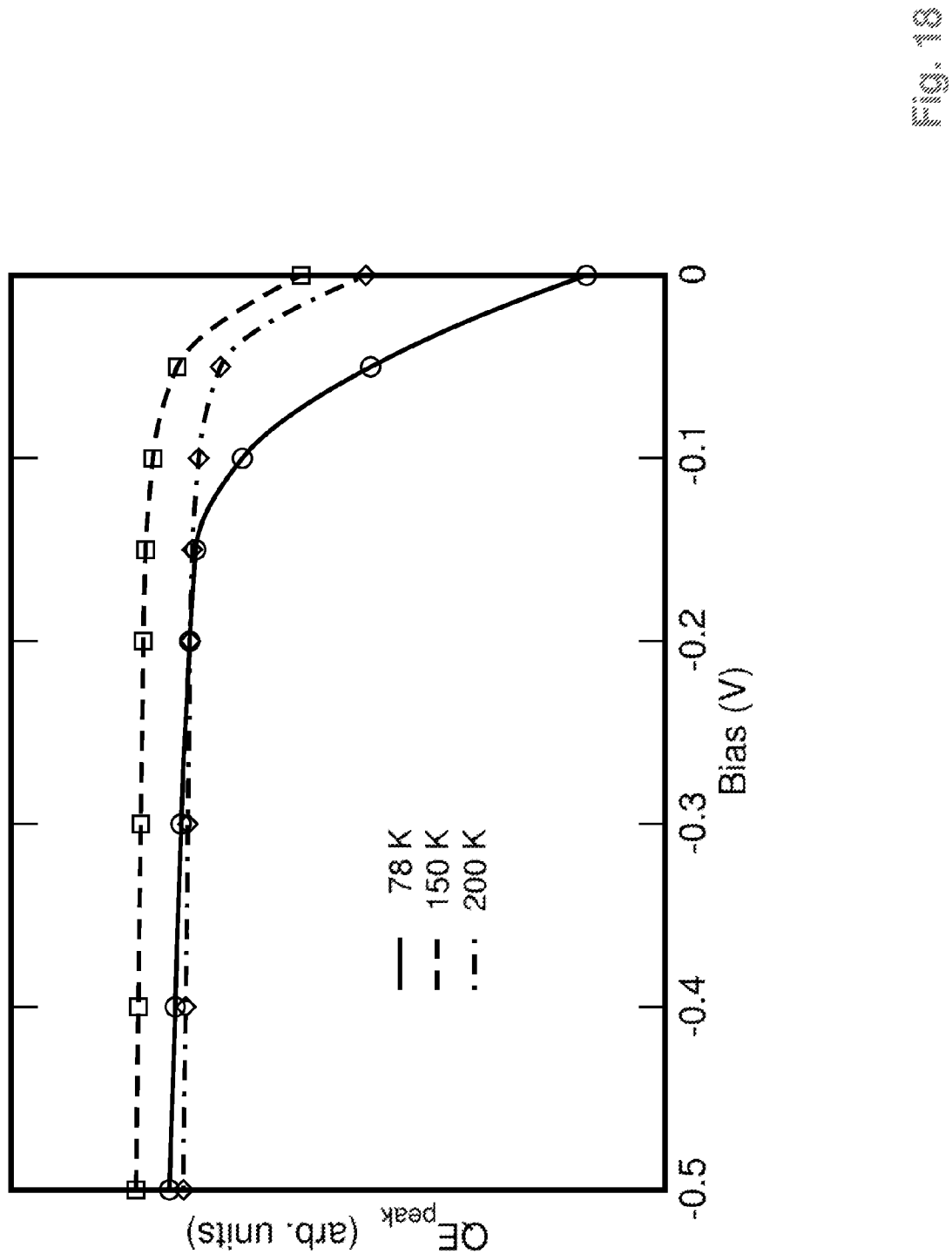
FIG. 19 provides a schematic illustration of the energy band diagram of a dual-band nBn detector structure with a grade-gap electron blocking unipolar barrier made in accordance with an embodiment of the current invention.
Figure 19:
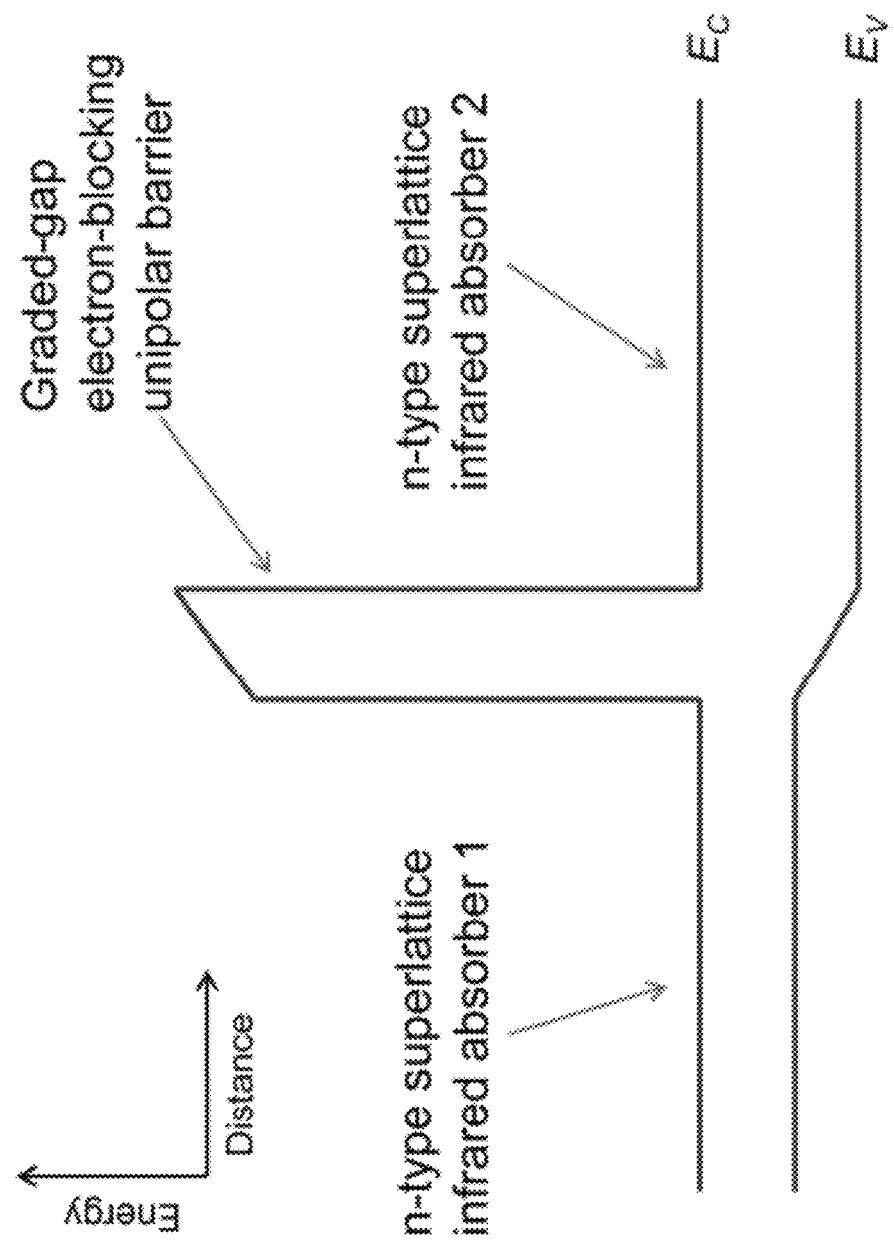

FIG. 19 shows the schematic energy band diagram of an exemplary embodiment of a dual-band nBn detector structure, consisting of an electron-blocking graded-gap unipolar barrier sandwiched between two absorber superlattices with different energy band gaps (hence different cutoff wavelengths) in accordance with the current invention. In such an embodiment, the two absorber superlattices could be made from strain-balanced n-type InAs/InAsSb superlattices with the same InAsSb alloy composition, but different periodicities. Similarly, the electron-blocking graded-gap unipolar barrier could be made from a 4-layer AlSb/AlAs/AlSb/GaSb superlattice with varying GaSb layer width as described earlier to smoothly bridge the valence band edges of the two absorbers superlattices.

Example 3

Dual-Band pBp Detector

Figure 20:
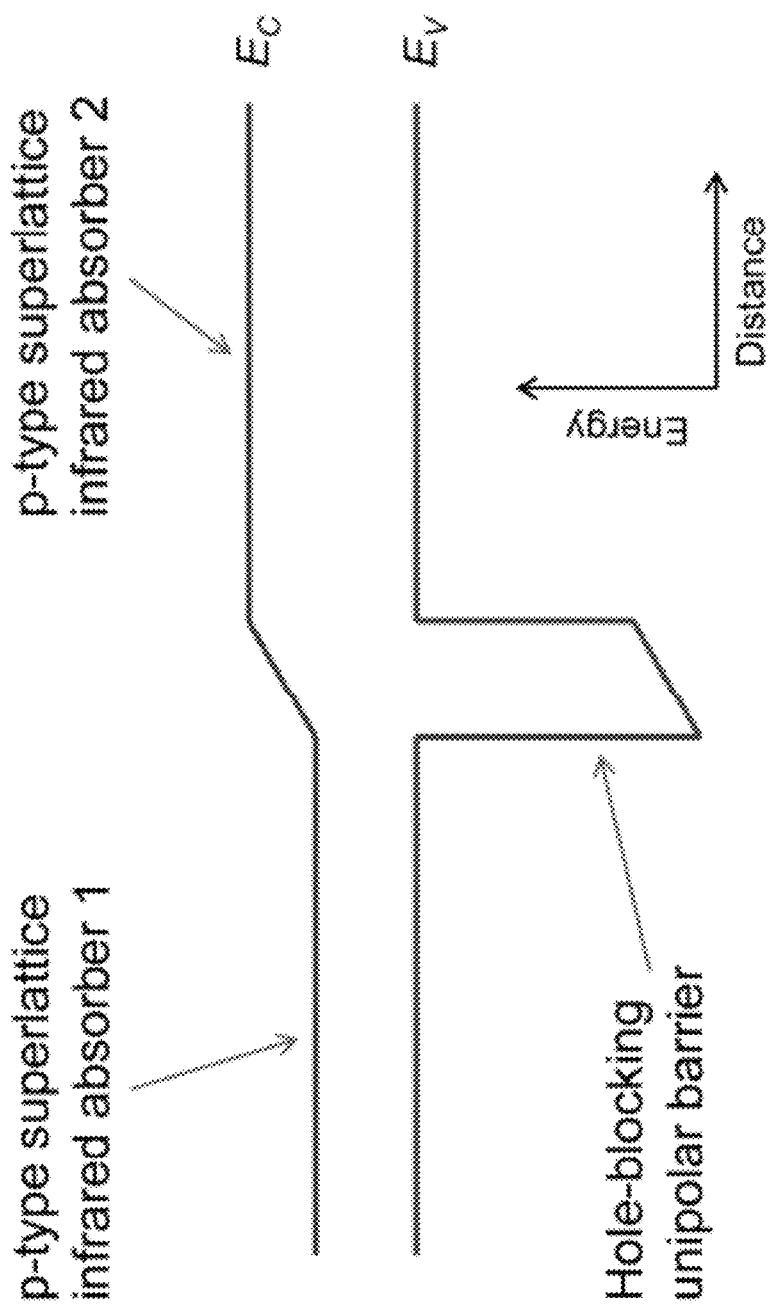
FIG. 20 provides a schematic illustration of the energy band diagram of a dual-band pBp detector structure barrier made in accordance with an embodiment of the current invention.

FIG. 20 shows the schematic energy band diagram of an exemplary dual-band pBp detector structure, consisting of a hole-blocking graded-gap unipolar barrier sandwiched between two p-type absorber superlattices with different energy band gaps in accordance with the current invention. In such an embodiment, the barrier and the two absorbers could all be made from InAs/InAsSb superlattices with the same InAsSb alloy composition, but different periodicities. Alternatively, the barrier could be made from an InAs/AlSb superlattice or an InAsSb/AlAsSb superlattice.

Example 4

Double Heterostructure Detector

Figure 21:
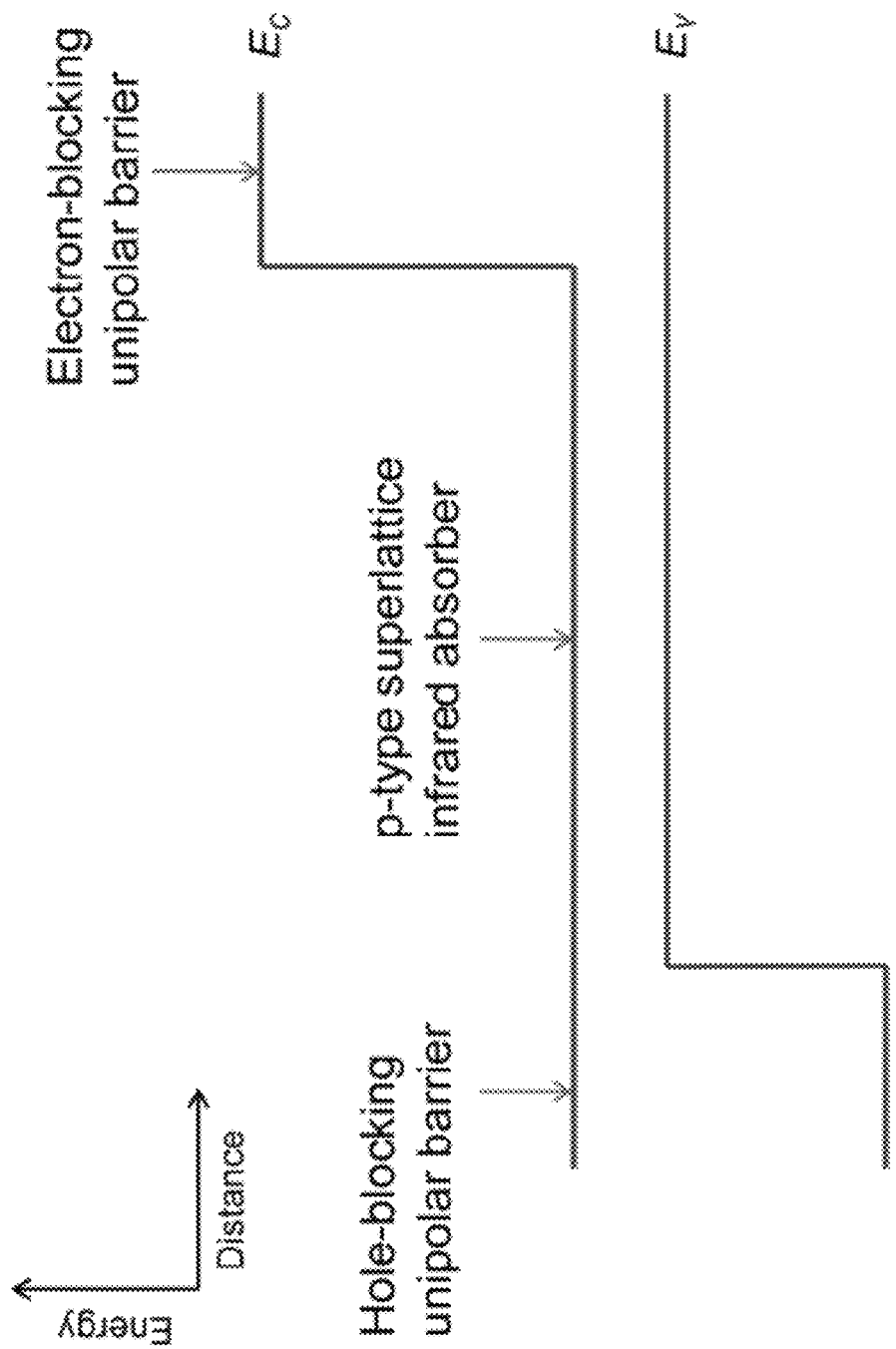
FIG. 21 provides a schematic illustration of the energy band diagram of a double heterostructure detector design barrier made in accordance with an embodiment of the current invention.

FIG. 21 shows the schematic energy band diagram of an exemplary embodiment of a double heterostructure (DH) detector design, consisting of a p-type absorber superlattices sandwiched between a hole-blocking unipolar barrier and an electron-blocking unipolar barrier in accordance with the current invention. In such an embodiment, the hole barrier and the absorber could be made from InAs/InAsSb superlattices with the same InAsSb alloy composition, but different periodicities, and the electron barrier could be made from a four-layer AlSb/AlAs/AlSb/GaSb superlattice. Alternatively, the hole barrier could be made from an InAs/AlSb superlattice or an InAsSb/AlAsSb superlattice, and the electron barrier could be made from AlAsSb.

Example 5

Complementary Barrier Detector

Figure 22:
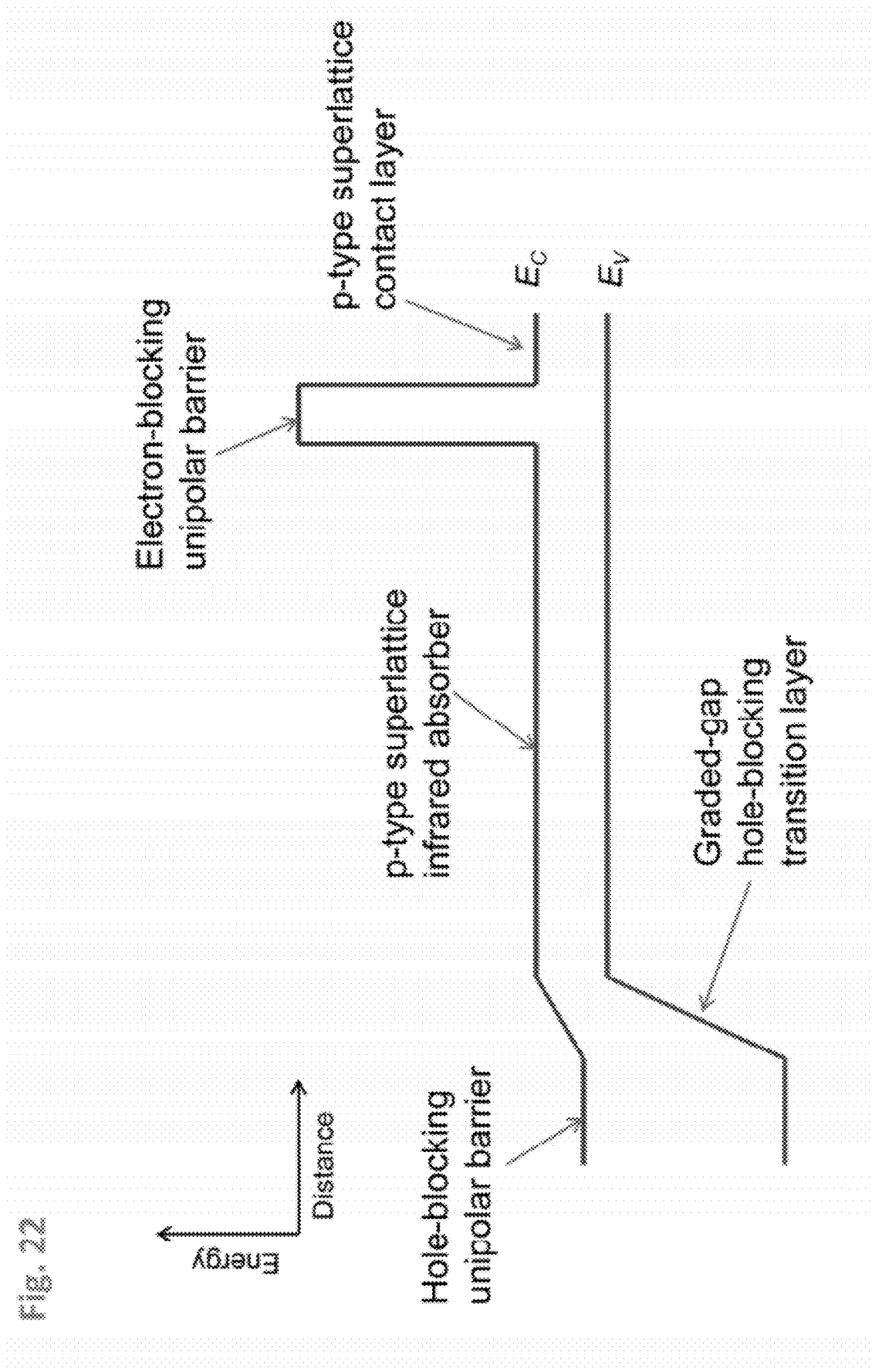
FIG. 22 provides a schematic illustration of the energy band diagram of a complementary barrier detector structure with a graded-gap transition region barrier made in accordance with an embodiment of the current invention.

FIG. 22 shows the schematic energy band diagram of an exemplary embodiment of a complementary barrier detector structure, consisting of, in order, a hole-blocking unipolar barrier, a graded-gap transition layer, a p-type absorber superlattice, an electron-blocking unipolar barrier, and a contact layer in accordance with the current invention. In such an embodiment, the hole barrier, the absorber, and the contact layer could be made from InAs/InAsSb superlattices, with the hole barrier having a larger band gap. Likewise, the transition layer could be made from a graded-gap InAs/InAsSb superlattice, and the electron barrier could be made from a four-layer AlSb/AlAs/AlSb/GaSb superlattice.

Example 6 nBn Detector With Graded-Gap Absorber

Figure 23:
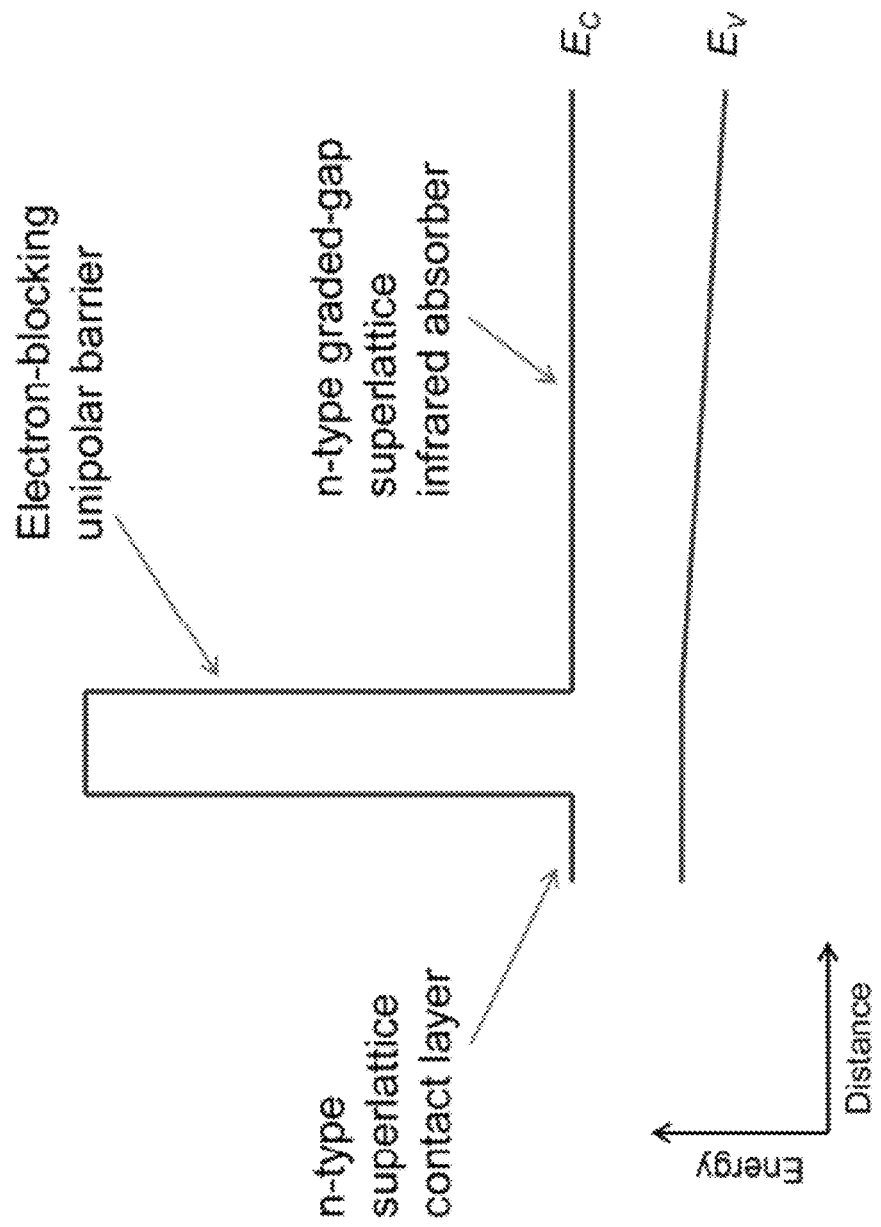
FIG. 23 provides a schematic illustration of the energy band diagram of an nBn detector structure with a graded-gap absorber barrier made in accordance with an embodiment of the current invention.

FIG. 23 shows the schematic energy band diagram of an exemplary embodiment of an nBn detector structure with a graded-gap absorber, consisting of an n-type contact layer, an intervening electron-blocking unipolar barrier, and an n-type graded-gap absorber in accordance with the current invention. In such an embodiment, the contact layer could be made from a strain-balanced n-type InAs/InAsSb superlattice. The electron-blocking unipolar barrier could be made from a 4-layer AlSb/AlAs/AlSb/GaSb superlattice, a 3-layer AlSb/AlAs/GaSb superlattice, or an AlSbAs alloy. Likewise, the absorber could be made from strain-balanced n-type graded-gap InAs/InAsSb superlattices with the same InAsSb alloy composition but varying periodicity.

Example 7

Manufacturing Method

Although all of the above discussion and exemplary embodiments have focused on devices or structures, the current invention is also directed to methods of manufacturing such devices and structures. Turning to the manufacture of the detectors of the instant invention, in working with barrier infrared detectors, it could be desirable to use structures that contain electron barriers in order to reduce electron surface leakage dark current. Such structures often call for the use of n-type semiconductor infrared absorbers where the minority carriers are holes. In superlattice based infrared absorbers, the hole mobility along the growth direction could be very poor. This reduces the quantum efficiency of the detector.

A "chirped" superlattice with graded energy band gap could be used to create a quasi-electric field, which aids in the collection of photo-generated carriers. When used in a focal plane array where the detector pixels are not fully reticulated, the graded-gap also help to reduce undesirable lateral current diffusion, which results in cross-talk. However, graded-gap superlattices are typically difficult to grow. For example, the InAs/GaSb superlattice requires the use of an InSb-like interface for strain-balancing. In grading the superlattice bandgap, it is necessary to change the periodicity of the superlattice, but as the periodicity of the InAs/GaSb superlattice changes, the strain-balancing condition (the amount of interfacial InSb insert) also changes. This presents a very challenging problem for material growth.

In contrast, the devices of the current invention allow for the use of a very simple scheme for the growth of a graded-gap superlattice, using InAs/InAsSb. As described above, in the current invention the InAs/InAsSb superlattice, grown on GaSb substrate, can be strain-balanced by adjusting the layer widths and the InAsSb composition. New strain-balanced structures can be derived from an existing strain-balanced structure by simply scaling the widths of the InAs and InAsSb layers by the same factor, without changing the composition of InAsSb. Moreover, growing a graded-gap InAs/InAsSb simply involves gradually changing the periodicity of the superlattice. Accordingly, this structure can be grown by keeping the In and As sources on continuously (at a pre-calibrated deposition rate), and turning the Sb source on and off with the proper timing sequence to produce the graded gap structure. In contrast, the InAs/GaSb superlattice would require turning the In and As source on during the growth of the InAs layers and off during the growth of the GaSb layers (and vice versa).

SUMMARY

In summary, a highly manufacturable superlattice-based infrared absorber and the matching electron-blocking and hole-blocking unipolar barriers have been described. In addition, absorbers and barriers with graded band gaps are also described. Using these building blocks, examples of high-performance infrared detectors have also been described. Data on a high operating temperature MWIR detector built according to the concepts described herein was also presented. In general, the barrier infrared detector of the current invention have the following characteristics:

The infrared absorber material used in accordance with the current invention is made from a superlattice (periodic structure) where each period consists of two or more layers of InAs, InSb, InSbAs, or InGaAs. The layer widths and alloy compositions are chosen to yield the desired energy band gap, absorption strength, and strain balance for the particular application. Furthermore, the periodicity of the superlattice can be "chirped" (varied) to create a material with a graded or varying energy band gap.

Unipolar barriers (either hole blocking or electron blocking) customized to operate with the specific superlattice absorber.

The infrared absorber of the current invention can be used in combination with any suitable barrier infrared detector structure, including nBn, pBp, XBn, double heterostructure (DH), and the complementary barrier infrared detector (CBIRD) type structures. In turn, the barrier could be made from a bulk semiconductor, a semiconductor alloy, or a semiconductor superlattice.

The detector itself can be used as single detectors, in linear arrays, and in focal plane arrays for any suitable imaging and spectrometry applications. The arrays can be fabricated in either a shallow-etch configuration, or in a fully reticulated manner (to reduce pixel-to-pixel cross talk).

Finally, absorbers made in accordance with the current invention with different detection cutoff wavelengths could be combined in the same detector structure to form a multi-band (multicolor) detector.

The InAs/InSbAs superlattice based barrier infrared detector described and demonstrated herein can be made to have a wide spectral range, including covering the entire 3-5 micron atmospheric transmission window, excellent dark current characteristics operating at 150K or above, high yield, and has the potential for high-operability, high-uniformity focal plane arrays. The proposed structures described above represent a novel combination that achieved high performance results. The infrared detector technology described here could be used for terrestrial applications or for earth observations through the atmospheric transmission window from space. It works at higher operating temperature, thus enables passive cooling in low earth orbit. This reduces mass and power (no cooler), and increase mission lifetime (no moving parts). In another application, the proposed device can be used in unmanned aircraft or any other small airborne platform in which available electrical power and weight load are limited.

Doctrine of Equivalents

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. An absorber layer for a barrier infrared photodetector comprising:
    a substrate formed of a substrate material having a substrate lattice constant;
    a superlattice disposed on the substrate, said superlattice being formed from a plurality of supercells, each of said supercells being formed from a plurality of layers of at least InAsSb and at least one semiconductor material selected from the group consisting of InAs, InAsSb, and InGaAs, and each layer being defined by a layer thickness such that each supercell has a period defined by the combined thicknesses of the plurality of layers in said supercell;
    wherein the combination of semiconductor materials in each layer of each supercell are chosen to yield a configuration substantially strain balanced to the substrate lattice constant;
    wherein the thickness of each of the layers does not exceed a critical thickness above which the layer is no longer coherently strained; and
    wherein the energy band gap structure of each supercell including the band gap, conduction band edge and the valence band edge of the superlattice depends on the structure of the supercell.

2. The absorber layer of claim 1, wherein the superlattice has a plurality of additional substantially strain balanced configurations determined by increasing the thicknesses of each of said layers of said superlattice by a constant factor "$\alpha$"; and
    wherein the period of the supercells of the superlattice varies such that the absorber layer has a graded energy band gap structure.

3. The absorber layer of claim 1, further comprising a unipolar hole barrier itself comprising:
    a hole barrier superlattice, said hole barrier superlattice being disposed on the substrate adjacent to said absorber layer superlattice;
    said hole barrier superlattice being formed from a plurality of hole barrier supercells, each of said hole barrier supercells being formed of a plurality of layers of at least two semiconductor materials selected from the group consisting of InAs/InAsSb, InAs/AlSb, InAsSb/AlAsSb, and InAs/AlInSb each having a material thickness such that each of said hole barrier supercells has a period defined by the combined thicknesses of the layers in each hole barrier supercell;
    wherein the energy band gap structure of the hole barrier including band gap, conduction band edge and valence band edge of the hole barrier superlattice depends on the structure of the hole-barrier supercell; and
    wherein the structure of the hole barrier is disposed such that the conduction band edge of the hole barrier superlattice substantially matches the conduction band edge of the absorber layer superlattice, while the band gap of the hole barrier provides a substantial barrier to holes from the absorber layer superlattice.

4. The absorber layer of claim 3, wherein the hole barrier supercell is formed from InAs and InAsSb, and wherein the period of the hole barrier is shorter than the period of the absorber layer; and
    wherein the absorber layer superlattice is formed of InAs and InAsSb, and wherein the InAsSb of the absorber layer superlattice has one of either a higher or the same Sb content than the InAsSb semiconductor material of the hole barrier.

5. The absorber layer of claim 3, wherein the unipolar hole barrier further comprises a graded energy band gap region comprising a graded superlattice region formed of a plurality of layers of semiconducting materials, said graded band gap region being disposed between the absorber layer superlattice and the hole barrier superlattice layer, wherein the period of the graded superlattice varies such that any discontinuity between the conduction band edge of the absorber layer superlattice and the conduction band edge of the hole barrier layer superlattice is smoothed.

6. The absorber layer of claim 1, further comprising an electron blocking unipolar barrier, said electron barrier being disposed on the substrate adjacent to said absorber layer superlattice;
   wherein the plurality of supercells in the absorber layer superlattice are formed from layers of one of either InAs and InAsSb or InGaAs and InAsSb; and
   wherein the electron barrier is formed from an electron barrier material selected from the group consisting of AlAsSb, AlGaSb or AlGaAsSb, wherein the alloy composition of the electron barrier material is selected such that the valence band edge of the electron barrier substantially matches the valence band edge of the absorber layer, while the band gap of the electron barrier provides a substantial barrier to electrons from said absorber layer.

7. The absorber layer of claim 1, further comprising an electron blocking unipolar barrier itself comprising:
   an electron barrier superlattice, said electron barrier superlattice being disposed on the substrate adjacent to said absorber layer superlattice;
   said electron barrier superlattice being formed from a plurality of electron barrier supercells, each of said electron barrier supercell being formed from a plurality of layers of at least two semiconductor materials, each of said semiconductor materials being defined by material thickness such that each of said electron barrier supercells has a period defined by the combined thicknesses of the layers in each electron barrier supercell;
   wherein the energy band gap structure of the electron barrier superlattice including the band gap, conduction band edge and valence band edge of the electron barrier superlattice depends on the structure of the supercell; and
   wherein the supercell is formed such that the valence band edge of the electron barrier superlattice substantially matches the valence band edge of the absorber layer superlattice, while the band gap of the electron barrier superlattice provides a substantial barrier to holes from the absorber layer superlattice.

8. The absorber layer of claim 7, wherein the electron barrier superlattice is selected from the group consisting of a plurality of two layer AlAsSb/GaSb supercells; a plurality of three layer supercells, wherein the plurality of three layer supercells are selected from one of either AlSb/AlAs/GaSb or AlSb/GaSb/AlAs, wherein the thickness ratio of the AlAs layer to the AlSb layer in the supercell is chosen such that the supercell is substantially strain balanced, and the thickness of the AlAs layer does not substantially exceed one monolayer; and a plurality of four layer supercells comprising AlSb/AlAs/Alsb/GaSb, wherein the thickness ratio of the AlAs layer to the sum of the AlSb layers in the supercell is chosen such that the supercell is substantially strain balanced and the thickness of the AlAs layer does not substantially exceed one monolayer; and
   wherein the valence band edge of the electron barrier is one of either adjusted or graded by varying the thickness of the GaSb layer.

9. An electron blocking unipolar barrier comprising:
   an electron barrier superlattice, said electron barrier superlattice being disposed on the substrate adjacent to an absorber layer;
   said electron barrier superlattice being formed from a plurality of electron barrier supercells, each of said electron barrier supercell being formed from a plurality of layers of at least two semiconductor materials, wherein the electron barrier superlattice is selected from the group consisting of a plurality of two layer AlAsSb/GaSb supercells; a plurality of three layer supercells, wherein the plurality of three layer supercells are selected from one of either AlSb/AlAs/GaSb or AlSb/GaSb/AlAs, wherein the thickness ratio of the AlAs layer to the AlSb layer in the supercell is chosen such that the supercell is substantially strain balanced, and the thickness of the AlAs layer does not substantially exceed one monolayer; and a plurality of four layer supercells comprising AlSb/AlAs/Alsb/GaSb, wherein the thickness ratio of the AlAs layer to the sum of the AlSb layers in the supercell is chosen such that the supercell is substantially strain balanced, and the thickness of the AlAs layer does not substantially exceed one monolayer;
   wherein each of said semiconductor materials is defined by material thickness such that each of said electron barrier supercells has a period defined by the combined thicknesses of the layers in each electron barrier supercell;
   wherein the energy band gap structure of the electron barrier superlattice including the band gap, conduction band edge and valence band edge of the electron barrier superlattice depends on the structure of the supercell;
   wherein the supercell is formed such that the valence band edge of the electron barrier superlattice substantially matches the valence band edge of the absorber layer superlattice, while the band gap of the electron barrier superlattice provides a substantial barrier to holes from the absorber layer superlattice; and
   wherein the valence band edge of the electron barrier is one of either adjusted or graded by varying the thickness of the GaSb layer.

10. An infrared photodetector comprising:
   a substrate formed of a substrate material having a substrate lattice constant;
   at least one absorber superlattice disposed on the substrate, each of said at least one absorber superlattices being formed from a plurality of supercells, each of said supercells being formed from a plurality of layers of at least InAsSb and at least one semiconductor material selected from the group consisting of InAs, InAsSb, and InGaAs, each of said layers having a material thickness such that each supercell has a period defined by the combined thickness of the plurality of semiconductor materials in each supercell, and wherein the combination of semiconductor materials in each layer of each supercell are chosen to yield a structure substantially strain balanced to the substrate lattice constant;
   at least two contacts layers disposed on the substrate and in electrical communication with said at least one absorber superlattice such that a current may pass therethrough;
   wherein the energy band gap structure of the absorber superlattice including the band gap, conduction balance edge and valence band edge of the superlattices depend on the structure of the supercell, and wherein the thickness of each of the layers does not exceed a critical thickness beyond which the layer is no longer coherently strained; and at least one unipolar barrier layer at least one of said unipolar barriers being disposed between said at least one absorber layer superlattice and said contact layer wherein the band gap structure of the unipolar barrier layer is designed such that each of the at least one barrier layer band gaps presents a substantial barrier between one of either the valence band edge or conduction band edge of said superlattice layers, while substantially matching the other of either the valence band edge or conduction band edge between said superlattice layers.

11. The photodetector of claim 10, wherein the photodetector is a dual-band nBn detector comprising two absorber superlattices have different energy band gap structures; and
wherein the at least one unipolar barrier layer is an electron blocking unipolar barrier disposed between the two absorber superlattices, wherein said electron blocking unipolar barrier has a graded band gap such that a substantial barrier is disposed between the conduction band edges of the two absorber superlattices while the valence band edges of said absorber superlattices are smoothly bridged;
wherein both the absorber superlattices are formed from InAs/InAsSb materials with identical composition but different periods; and
wherein the electron blocking unipolar barrier is formed from a four layer superlattice comprising AlSb/AlAs/AlSb/GaSb, and wherein the valence band edge of said electron barrier is graded by varying the thickness of the GaSb layer.

12. The photodetector of claim 10, wherein the photodetector is a dual-band pBp detector comprising two absorber superlattices having different energy band gap structures; and
wherein the at least one unipolar barrier layer is a hole blocking unipolar barrier disposed between the two absorber superlattices, wherein said hole blocking unipolar barrier has a graded band gap such that a substantial barrier is disposed between the valence band edges of the two absorber superlattices while the conduction band edges of said absorber superlattices are smoothly bridged.

13. The photodetector of claim 12, wherein both the absorber superlattices are formed from InAs/InAsSb materials with identical composition but different periods; and
wherein the hole blocking unipolar barrier is formed from a superlattice material selected from the group consisting of InAs/AlSb, InAsSb/AlAsSb, and InAs/InAsSb wherein the InAs/InAsSb superlattice that forms the hole blocking unipolar barrier has an identical composition to the absorber superlattices, but a different period.

14. The photodetector of claim 10, wherein the photodetector is a double heterostructure detector comprising a single absorber superlattice being p-type doped, and further comprising two barrier layers disposed at either end of said absorber superlattice;
wherein one of said barrier layers is an electron blocking unipolar barrier such that at a first end of the absorber superlattice a substantial barrier is formed against the conduction band edge thereof while the valence band edge is substantially matched to the valence band edge of an adjacent contact layer thereto; and
wherein one of said barrier layers is a hole blocking unipolar barrier such that at a second end of the absorber superlattice a substantial barrier is formed against the valence band edge thereof while the conduction band edge is substantially matched to the conduction band edge of an adjacent contact layer thereto.

15. The photodetector of claim 14, wherein the absorber superlattice is formed from an InAs/InAsSb superlattice;
the hole barrier is formed from one of either an InAs/AlSb superlattice having identical composition to the absorber superlattice but different period or an InAsSb/AlAsSb superlattice; and
the electron barrier is formed from one of either an AlAsSb superlattice or a four layer superlattice comprising AlSb/AlAs/AlSb/GaSb, wherein the band edges of the electron barrier are graded by varying the thickness of the GaSb layer.

16. The photodetector of claim 10, wherein the photodetector is a complementary barrier detector comprising:
a single absorber superlattice being p-type doped;
an electron blocking unipolar barrier layer disposed between a first ends of said absorber superlattice and said contact layer; and
further comprising:
a hole blocking unipolar barrier layer disposed at a second end of said p-type absorber superlattice; and
a graded-gap transition layer superlattice disposed between said p-type absorber superlattice and said hole blocking unipolar barrier layer.

17. The photodetector of claim 16, wherein the hole barrier, the absorber superlattice and the contact layer are all formed from InAs/InAsSb superlattices having identical composition but different period such that the hole barrier has a larger band gap;
wherein the transition layer superlattice is formed from an InAs/InAsSb superlattice having a period that varies such that the band gap of said transition layer superlattice is graded such that the conduction band edges of said hole barrier and said absorber superlattice are smoothly bridged; and
wherein the electron barrier is formed from a four layer superlattice comprising AlSb/AlAs/AlSb/GaSb, wherein the valence band edge of the electron barrier is graded by varying the thickness of the GaSb layer.

18. The photodetector of claim 10, wherein the period of the absorber layer superlattice varies such that the band gap of the absorber layer is graded such that one or both the valence band edge or conduction band edge between said absorber superlattice and said unipolar barrier are smoothly bridged.

19. The photodetector of claim 18, wherein the absorber layer and contact layer are formed from InAs/InAsSb superlattices having identical composition but different period; and
wherein the unipolar barrier is an electron blocking unipolar barrier formed from a four layer superlattice comprising AlSb/AlAs/AlSb/GaSb, a 3-layer AlSb/AlAs/GaSb superlattice, or an AlSbAs alloy.

20. The photodetector of claim 10, wherein each of said contact layers is selected from the group consisting of superlattices comprised of a plurality of contact supercells, each of said contact supercells being formed from a plurality of layers formed of at least two semiconductor materials each of said layers having a material thickness such that each contact supercell has a contact period defined by the combined thickness of the plurality of semiconductor materials in each contact supercell; an InAs/InSbAs superlattice material; and GaSb in a broken-gap tunnel junction.

* * * * *